(12) United States Patent
Minami et al.

(10) Patent No.: US 7,995,369 B2
(45) Date of Patent: Aug. 9, 2011

(54) SEMICONDUCTOR MEMORY DEVICE

(75) Inventors: Yoshihiro Minami, Yokosuka (JP); Ryo Fukuda, Yokohama (JP); Takeshi Hamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 12/332,595

(22) Filed: Dec. 11, 2008

(65) Prior Publication Data
US 2009/0152610 A1 Jun. 18, 2009

(30) Foreign Application Priority Data

Dec. 12, 2007 (JP) .................................. 2007-320984

(51) Int. Cl.
*G11C 17/00* (2006.01)
(52) U.S. Cl. .................. 365/103; 257/296; 257/E29.17; 257/E29.255; 365/174; 365/175; 365/182; 365/186; 365/104; 365/105; 365/94
(58) Field of Classification Search .................. None
See application file for complete search history.

(56) References Cited

U.S. PATENT DOCUMENTS

| | | | |
|---|---|---|---|
| 7,265,419 B2 | 9/2007 | Minami | |
| 2003/0206467 A1* | 11/2003 | Peng et al. ..................... | 365/200 |
| 2006/0244099 A1* | 11/2006 | Kurjanowicz ................ | 257/530 |
| 2008/0111187 A1 | 5/2008 | Minami | |

OTHER PUBLICATIONS

Matthew Crowley, et al., "512Mb PROM with 8 Layers of Antifuse/Diode Cells", 2003 IEEE International Solid-State Circuits Conference Digest of Technical Papers, 4 pages.
Feng Li, et al., "Evaluation of SiO2 Antifuse in a 3D-OTP Memory", IEEE Transactions on Device and Materials Reliability, vol. 4, No. 3, Sep. 2004, pp. 416-421.
S. B. Herner, et al., "Vertical p-i-n Polysilicon Diode With Antifuse for Stackable Field-Programmable ROM", IEEE Electron Device Letters, vol. 25, No. 5, May 2004, pp. 271-273.
Hiroshi Ito, et al., "Pure CMOS One-time Programmable Memory using Gate-Ox Anti-fuse", IEEE 2004 Custom Integrated Circuits Conference, pp. 469-472.

* cited by examiner

*Primary Examiner* — Minh-Loan T Tran
*Assistant Examiner* — Fei Fei Yeung Lopez
(74) *Attorney, Agent, or Firm* — Oblon, Spivak, McClelland, Maier & Neustadt, L.L.P.

(57) ABSTRACT

This disclosure concerns a semiconductor memory device including bit lines; word lines; semiconductor layers arranged to correspond to crosspoints of the bit lines and the word lines; bit line contacts connecting between a first surface region and the bit lines, the first surface region being a part of a surface region of the semiconductor layers directed to the word lines and the bit lines; and a word-line insulating film formed on a second surface region adjacent to the first surface region, the second surface region being a part of out of the surface region, the word-line insulating film electrically insulating the semiconductor layer and the word line, wherein the semiconductor layer, the word line and the word-line insulating film form a capacitor, and when a potential difference is given between the word line and the bit line, the word-line insulating film is broken in order to store data.

16 Claims, 31 Drawing Sheets

SECOND EMBODIMENT

FIG. 12 THIRD EMBODIMENT

FIG. 14 FOURTH EMBODIMENT

FIFTH EMBODIMENT

FIG. 21 SIXTH EMBODIMENT

SEVENTH EMBODIMENT

EIGHTH EMBODIMENT

NINTH EMBODIMENT

FIG. 25  TENTH EMBODIMENT

FIG. 26 ELEVENTH EMBODIMENT

FIG. 27  TWELFTH EMBODIMENT

FIG. 28 THIRTEENTH EMBODIMENT

FOURTEENTH EMBODIMENT

FIFTEENTH EMBODIMENT

SIXTEENTH EMBODIMENT

SEMICONDUCTOR MEMORY DEVICE

CROSS-REFERENCE TO RELATED APPLICATION

This application is based upon and claims the benefit of priority from the prior Japanese Patent Applications No. 2007-320984, filed on Dec. 12, 2007, the entire contents of which are incorporated herein by reference.

BACKGROUND OF THE INVENTION

1. Field of the Invention

The present invention relates to a semiconductor memory device, and for example, relates to a semiconductor memory device that stores data by breaking a MOS (Metal-Oxide Semiconductor) capacitor gate dielectric film.

2. Related Art

To improve yield of various types of large-scale memories, redundancy is utilized. The redundancy is a technique in which a coordinate of a previously specified defective cell is stored so that the defective cell is not accessed during an actual use. To store the coordinate of the defective cell, a ROM (read-only memory) is utilized. Examples of ROMs include a memory that stores data by breaking the insulating film of a capacitor, for example. In such an insulating-film breakdown ROM, a write process (insulating-film breaking process) for storing the coordinate of a defective location can suffice only once. Storage by the insulating-film breaking process is highly reliable.

However, the conventional insulating-film breakdown ROM has vertical capacitors and diodes stacked in a vertical direction relative to a plane on which bit lines or word lines are formed. A manufacturing step of forming such capacitors and diodes piled up stereoscopically (three-dimensionally) is complicated and requires a dedicated manufacturing step. Accordingly, there is a problem in that such a conventional insulating-film breakdown ROM results in a high cost.

In a document of 2004 IEEE Custom Integrated Circuits Conference (CICC 2004), p.p. 469-472, an insulating-film breakdown ROM is formed by using a planar device. However, to constitute the insulating-film breakdown ROM, a plurality of p-type MOSFETs need to be used. In this case, the occupied area of the ROM increases.

SUMMARY OF THE INVENTION

A semiconductor memory device according to an embodiment of the present invention comprises: bit lines extending in a first direction; word lines extending in a second direction crossing the first direction; semiconductor layers arranged to correspond to crosspoints of the bit lines and the word lines; bit line contacts connecting between a first surface region and the bit lines, the first surface region being a part of a surface region of the semiconductor layers directed to the word lines and the bit lines; and a word-line insulating film formed on a second surface region adjacent to the first surface region, the second surface region being a part of out of the surface region of the semiconductor layer, the word-line insulating film electrically insulating the semiconductor layer and the word line, wherein
the semiconductor layer, the word line and the word-line insulating film form a capacitor, and
when a potential difference is given between the word line and the bit line, the word-line insulating film is broken in order to store data.

DETAILED DESCRIPTION OF THE INVENTION

Embodiments of the present invention will be explained below in detail with reference to the accompanying drawings. Note that the invention is not limited thereto.

First Embodiment

Figure 1:
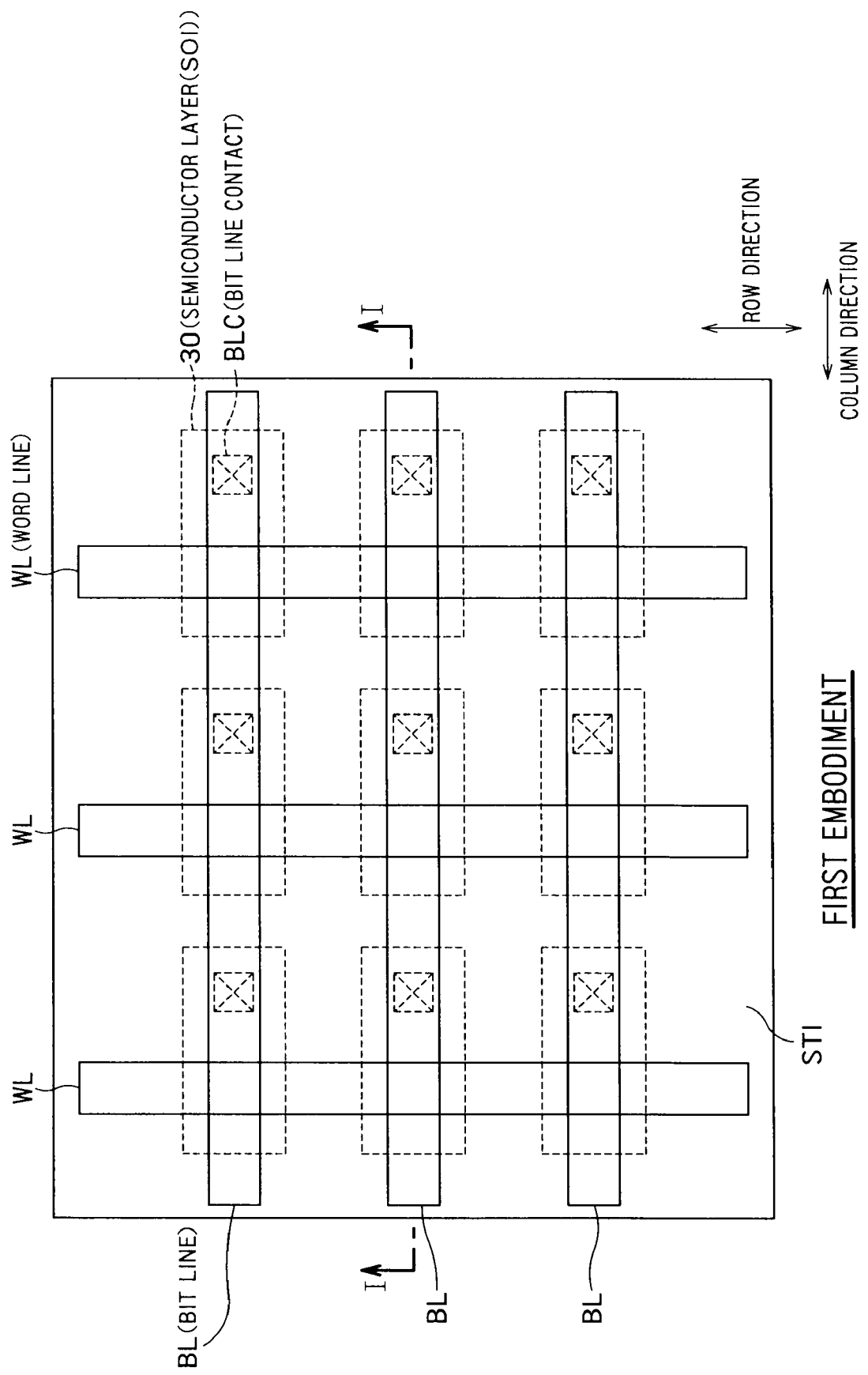
FIG. 1 is a plan view of a cell array region of an insulating-film breakdown ROM according to a first embodiment of the present invention.

FIG. 1 is a plan view of a cell array region of an insulating-film breakdown ROM according to a first embodiment of the present invention. The ROM according to the first embodiment includes a plurality of bit lines BL extending in a column direction which is a first direction and a plurality of word lines WL extending in a row direction which is a second direction crossing the column direction. Semiconductor layers 30 are formed in an island shape to correspond to crosspoints of the bit lines BL and the word lines WL. Regions in which the semiconductor layers 30 are present are SOI (Silicon On Insulator)-structured. The semiconductor layers 30 are each electrically isolated by STI (Shallow Trench Isolation). A memory cell of the insulating-film breakdown ROM is arranged one each in the semiconductor layers 30.

Each word line WL is made of doped polysilicon, for example. Each bit line BL is made of copper, for example.

Figure 2:
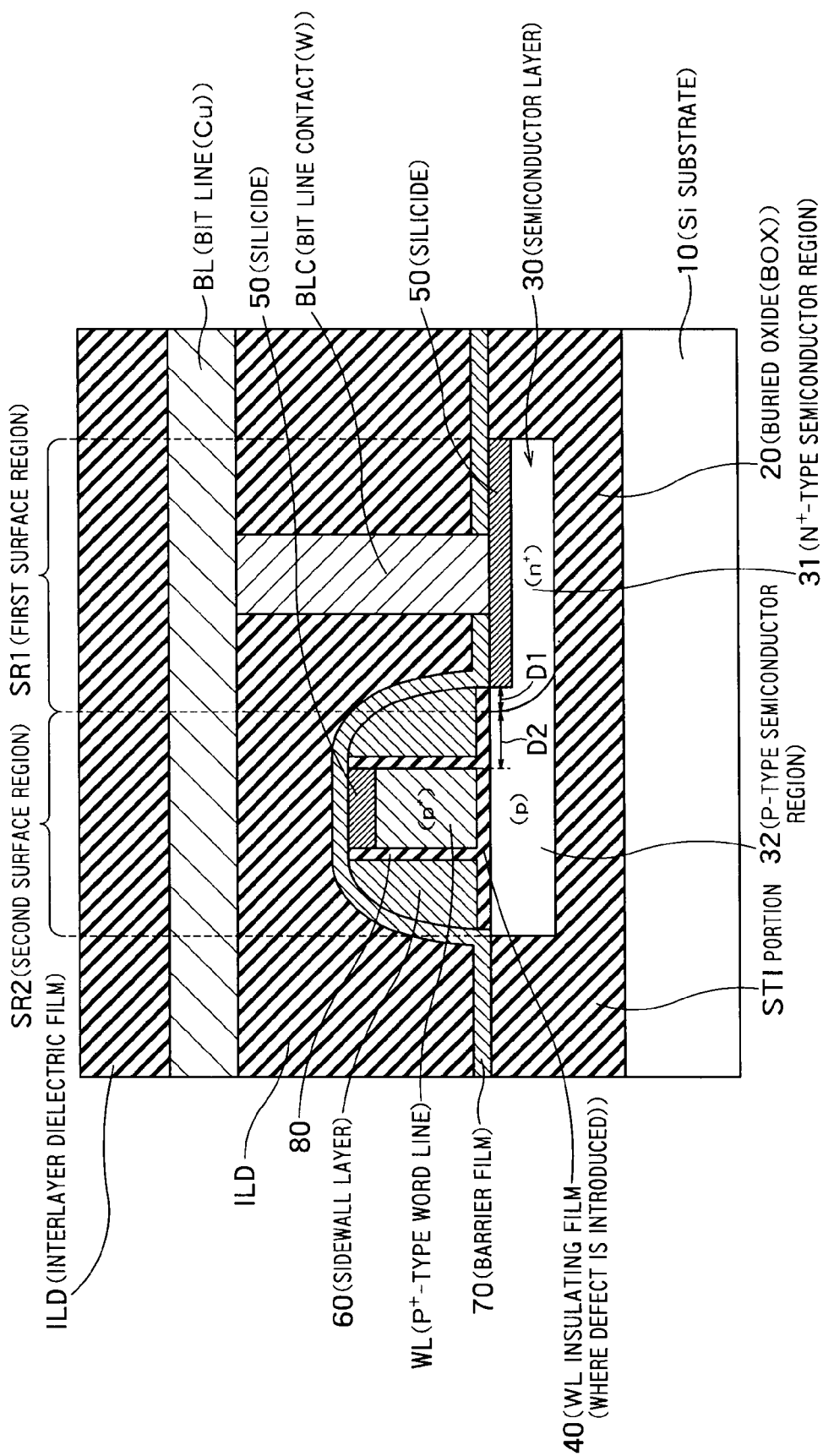
FIG. 2 is a cross-sectional view taken along line I-I in FIG. 1.

FIG. 2 is a cross-sectional view taken along line I-I in FIG. 1. The ROM according to the first embodiment is formed on an SOI substrate. The SOI substrate is constituted by: a silicon substrate 10; an embedded insulating film (hereinafter, also called "BOX layer") 20 arranged on the silicon substrate 10; and an SOI layer arranged on the BOX layer 20. Each semiconductor layer 30 is formed by processing the SOI layer.

The semiconductor layer 30 has a surface region of the semiconductor layer 30 directed to each word line WL and each bit line BL. The surface region of the semiconductor layer 30 includes a first surface region SR1 connected with a bit line contact BLC and a second surface region SR2 in which the word line WL is arranged via a word-line insulating film 40. The semiconductor layer 30 includes an n$^+$-type semiconductor region 31, which is a first semiconductor region, beneath the first surface region SR1, and a p-type semiconductor region 32, which is a second semiconductor region, beneath the second surface region SR2. Between the semiconductor region 31 and the semiconductor region 32, a pn junction is formed.

Each bit line contact BLC is a metal plug arranged within an interlayer dielectric film ILD, and made of tungsten, for example. The bit line contact BLC electrically connects between the bit line BL and the semiconductor region 31 in the semiconductor layer 30.

On the second surface region of the semiconductor layer 30, the word-line insulating film 40 is arranged. On the word-line insulating film 40, the word line WL is arranged. Each word line WL is made of p$^+$-type polysilicon, for example. The word-line insulating film 40 electrically insulates the word line WL from the semiconductor layer 30.

The first surface region SR1 and the second surface region SR2 of the semiconductor layer 30 are adjacent each other. Immediately beneath the bit-line contact BLC, the semiconductor region 31 only is present via silicide 50, and the semiconductor region 32 is not present. On the other hand, immediately beneath the word line WL, the semiconductor region 32 only is present via the word-line insulating film 40, and the semiconductor region 31 is not present. That is, the bit line contact BLC has its entire bottom present on the first surface region SR1, and the word line WL has its entire bottom present on the second surface region SR2. Above the pn junction between the semiconductor region 31 and the semiconductor region 32, neither the word line WL nor the bit line contact BLC are present.

On each of the word line WL and the semiconductor region 31, the silicide 50 is arranged. Thereby, the resistance of the word line WL and the contact resistance of the bit line contact BLC are decreased. On the side surface of the word line WL, an insulating film 80 and a side-wall layer 60 are arranged. The insulating film 80 and the side-wall layer 60 function as a mask (spacer) at the time of introducing impurities into the semiconductor region 31 and at the time of forming the silicide 50.

A barrier film 70 is formed on the silicide 50, the insulating film 80, and the side-wall layer 60, and the interlayer dielectric film ILD is deposited on top of the barrier film 70. The silicide 50 is nickel silicide, for example. The bit line BL is embedded within the interlayer dielectric film ILD. The insulating film 80 and the side-wall layer 60 are made of a silicon oxide film, for example. The barrier film 70 is made of a silicon nitride film, for example.

The semiconductor layer 30, the word-line insulating film 40, and the word line WL form a MOS capacitor. The word-line insulating film 40 of the MOS capacitor is broken when a potential difference is given between the word line WL and the bit line BL. When the word-line insulating film 40 is broken, the word line WL and the semiconductor layer 30 are conducted. When the word-line insulating film 40 is not broken, a non-conductive state is maintained between the word line WL and the semiconductor layer 30. Thereby, the MOS capacitor stores binary data of "0" or "1". The data is used for indicating a defective location of a main memory, for example.

The pn junction (diode) formed between the semiconductor regions 31 and 32 is arranged to protect memory cells not targeted for programming. Each memory cell according to the first embodiment is formed of one capacitor and one diode.

Figure 3:
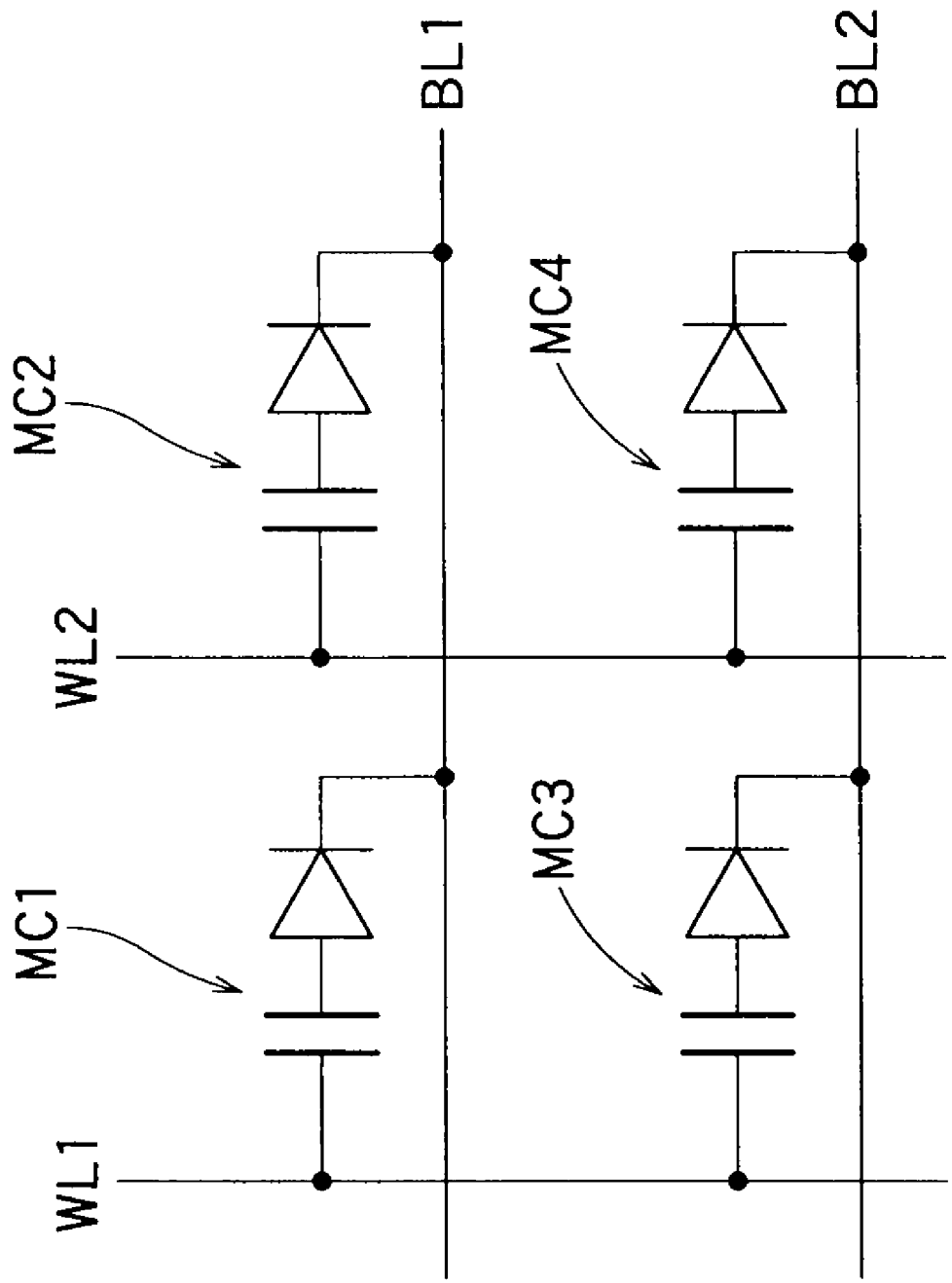
FIG. 3 is an equivalent circuit diagram showing four memory cells MC1 to MC4.

FIG. 3 is an equivalent circuit diagram showing four memory cells MC1 to MC4. The memory cells MC1 to MC4 are arranged to correspond to each crosspoint of word lines WL1 and WL2 and bit lines BL1 and BL2. Cathodes (first semiconductor regions 31) of diodes included in the respective memory cells MC1 and MC2 are connected to the bit line BL1. Cathodes (first semiconductor regions 31) of diodes included in the respective memory cells MC3 and MC4 are connected to the bit line BL2. One electrodes of the MOS capacitors included in the respective memory cells MC1 and MC3 function as the word line WL1. One electrodes of the MOS capacitors included in the respective memory cells MC2 and MC4 function as the word line WL2. The other electrodes of the MOS capacitors included in the respective memory cells MC1 to MC4 are connected to anodes (second semiconductor regions 32) of the diodes included in the respective memory cells MC1 to MC4.

For example, when the word-line insulating film 40 of the memory cell MC2 is broken (hereinafter, also called "blown"), a high-level potential Vp is applied to the word line WL2 and a low-level potential V0 is applied to the word line WL1, and the low-level potential V0 is applied to the bit line BL1 and the high-level potential Vp is applied to the bit line BL2. Thereby, by the word line WL2 and the bit line BL1, a potential difference (Vp−V0) is generated in the memory cell MC2. The potential difference biases the diode in the memory cell MC2 in a forward direction, and thus, nearly all of the potential difference (Vp−V0) is given to the capacitor of the memory cell MC2. As a result, a current is passed from the word line WL2 via the memory cell MC2 to the bit line BL1, and thereby, the MOS capacitor in the memory cell MC2 is blown.

In contrary thereto, no potential differences are generated in the memory cells MC1 and MC4. In the memory cell MC3, the potential difference (Vp−V0) is generated, and the potential difference, however, biases the diode of the memory cell MC3 in a reverse direction. Accordingly, unless the diode is collapsed, the potential difference is not given to the MOS capacitor of the memory cell MC3. As a result, the MOS capacitor of each of the memory cells MC1, MC3, and MC4 is not broken, and maintains the current condition. The diode of each memory cell prevents a reverse bias of the diode from applying to the MOS capacitor, and thereby preventing the memory cells MC other than those targeted for programming from being blown.

In the first embodiment, as shown in FIG. 2, each word line WL is not present on the pn junction between the semiconductor regions 31 and 32 but arranged on the semiconductor region 32 kept apart only by a distance D2. When the word-line insulating film 40 is present above the pn junction, for example, at the time of applying a reverse bias to the diode as in the memory cell MC3, the bias is directly applied to the word-line insulating film 40 between the word line WL1 and the first semiconductor region 31. Accordingly, it is probable that not only the memory cell MC1 targeted for programming but also the MOS capacitor of the memory cell MC3 is blown. In this case, the MOS capacitor of the memory cell MC3 is directly short-circuited between the word line WL1 and the first semiconductor region 31.

On the other hand, when the word line WL is not present on the pn junction between the semiconductor regions 31 and 32 as in the first embodiment, if the reverse bias is applied to the diode, the reverse bias is applied only to the diode, and is not directly applied to the word-line insulating film 40. A current when the MOS capacitor is blown passes through the semiconductor regions 32 and 31 all the time. As a result, as stated above, for example, the capacitor of the memory cell MC1 can be blown without blowing the capacitor of the memory cell MC3. Thus, when the word line WL and the pn junction are kept apart, the protection function of the capacitor by the diode can be fully demonstrated.

Generally, as the area of the word-line insulating film 40 used for the capacitor (area of the second semiconductor region 32 facing the word line WL) is smaller, the breakdown (programming (writing)) becomes more difficult. On the other hand, to facilitate the breakdown of the word-line insulating film to a certain extent, it is effective to implant an element such as xenon (Xe) within the word-line insulating film 40. Xenon does not adversely affect the diode characteristic of the memory cell, and thus, a write characteristic can be improved without deteriorating a read characteristic of the memory cell. That is, when the element such as xenon (Xe) is implanted within the word-line insulating film 40, the area of the word-line insulating film 40 used for the capacitor can be made smaller. As a result, the occupied area of each memory cell MC can be made small.

A manufacturing method of the insulating-film breakdown ROM according to the first embodiment is described next. FIG. 4 to FIG. 8 are cross-sectional views each showing the manufacturing method of the insulating-film breakdown ROM.

Figure 4:
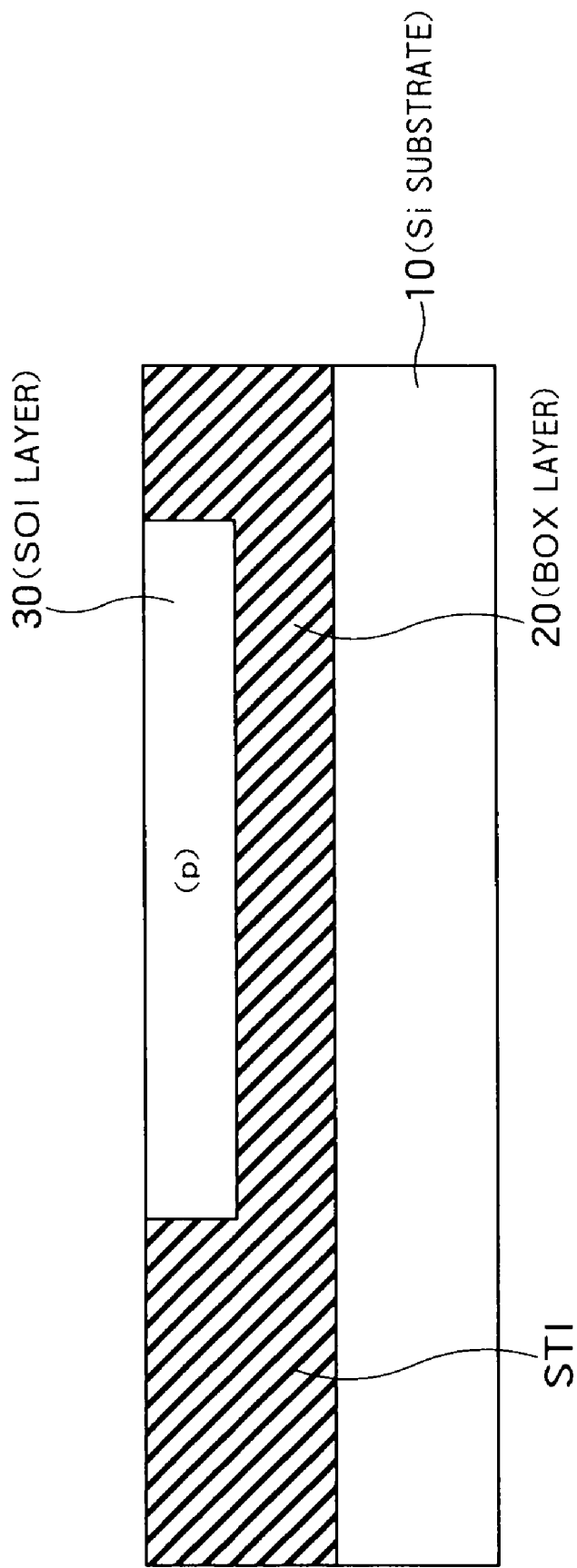
FIG. 4 to FIG. 8 are cross-sectional views each showing the manufacturing method of the insulating-film breakdown ROM according to the first embodiment.

First, an SOI substrate having the silicon substrate 10, the BOX layer 20, and the SOI layer 30 is prepared. Lithography and RIE (Reactive Ion Etching) are used to process the SOI layer 30 in an island shape. Thereby, between a plurality of adjacent SOI layers 30, silicon oxide films are filled, resulting in the formation of the element isolation STI. In FIG. 4, one SOI layer 30 processed in an island shape is displayed. Each SOI layer 30 is previously ion-implanted with p-type impurities such as boron.

Figure 5:
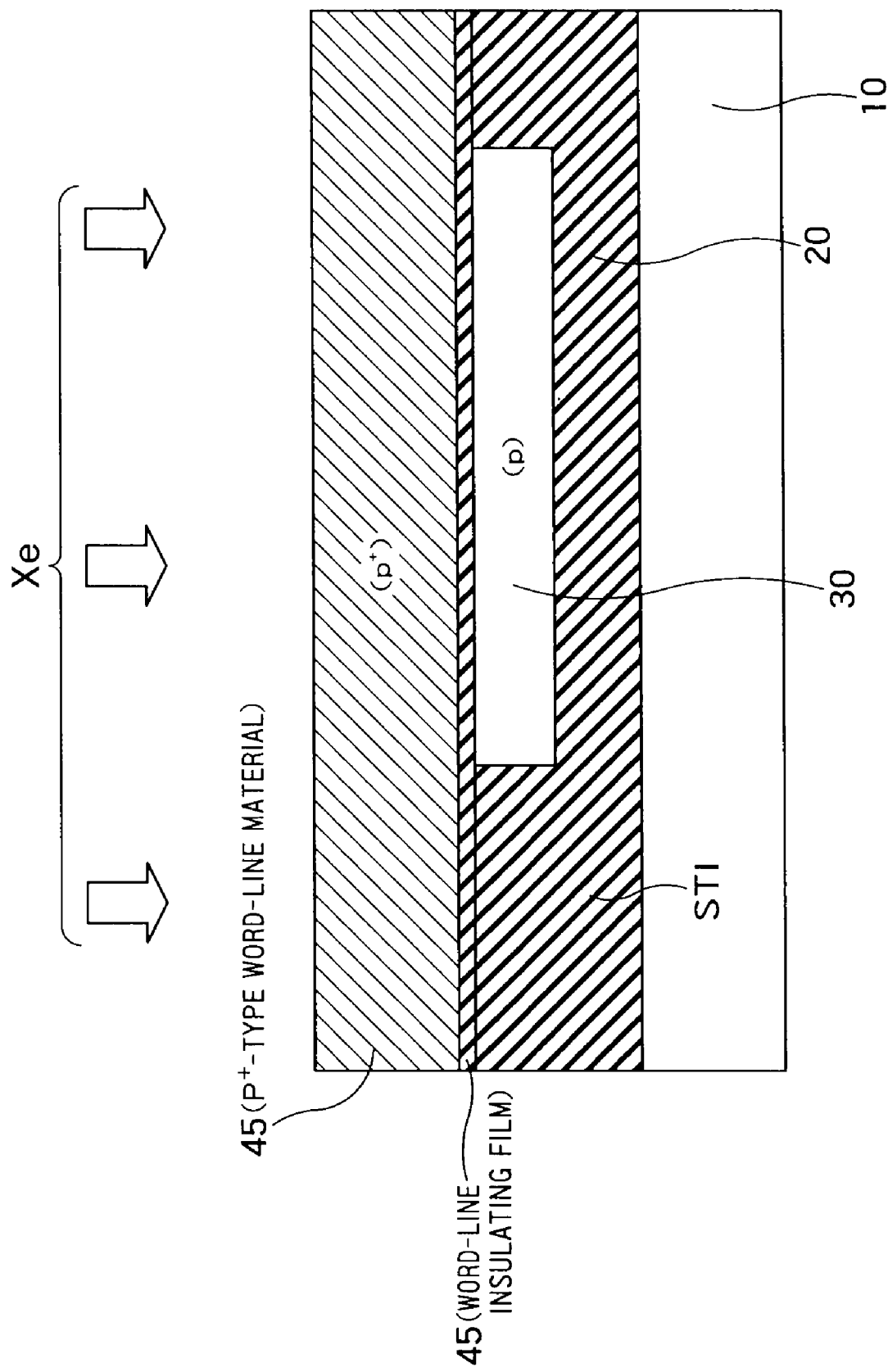

Next, as shown in FIG. 5, the word-line insulating film 40 is formed on the SOI layer 30. The word-line insulating film 40 can be formed by a step similar to a step of forming a gate dielectric film in a CMOS manufacturing process. On the word-line insulating film 40, a $p^+$-type word-line material 45 is deposited. To convert the word-line material 45 into a highly concentrated $p^+$-type, a method in which polysilicon is deposited while diffusing p-type impurities, or a method in which after the deposition, the p-type impurities are ion-implanted is used.

Next, as shown in FIG. 5, in order to induce a moderate defect in the word-line insulating film 40, impurities (for example, Xe) are ion-implanted. The introduction of impurities to induce the defect in the word-line insulating film 40 can be executed by the time that the interlayer dielectric film ILD is formed after the deposition of the word-line material 45.

Figure 6:
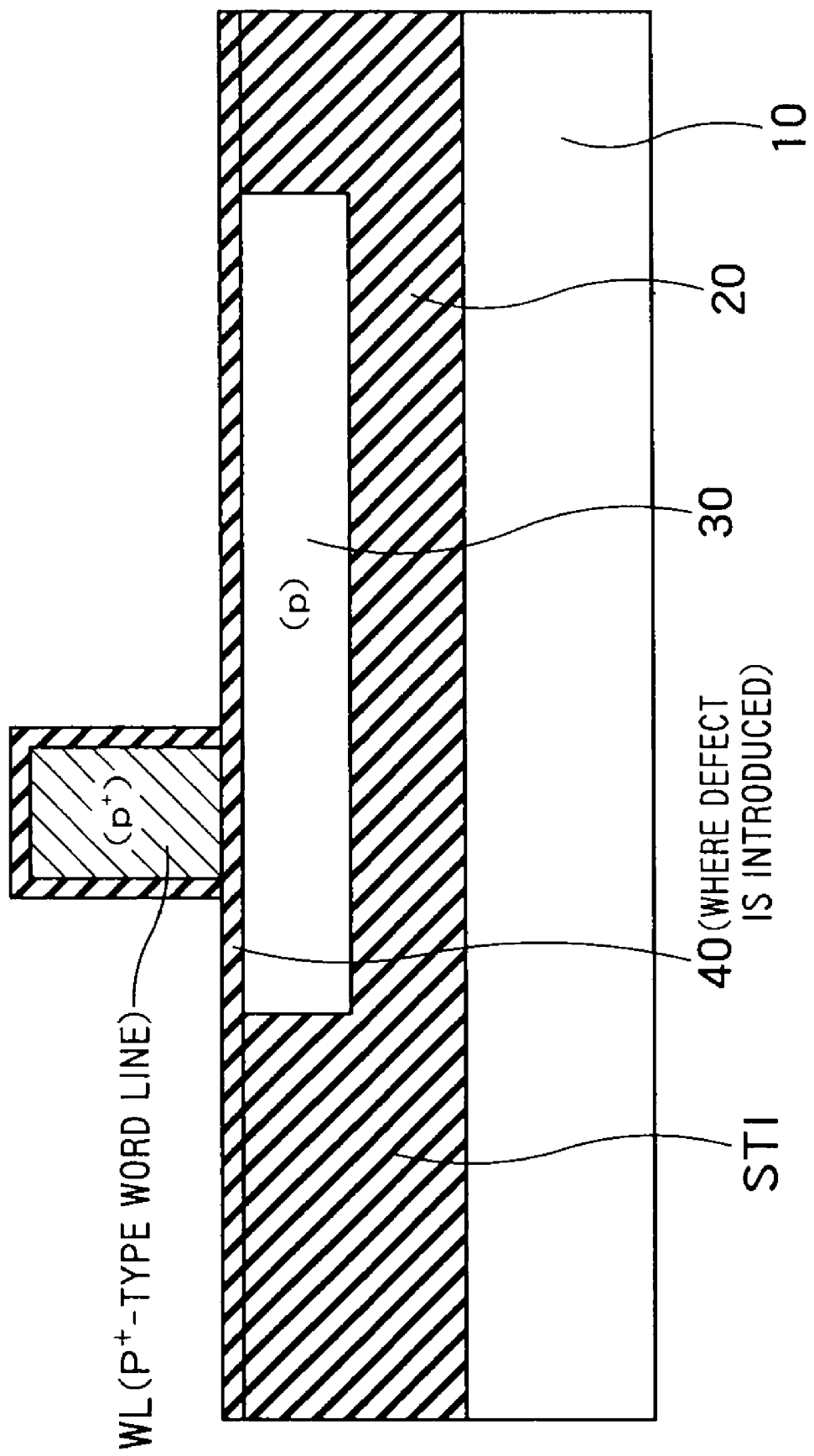
Figure 7:
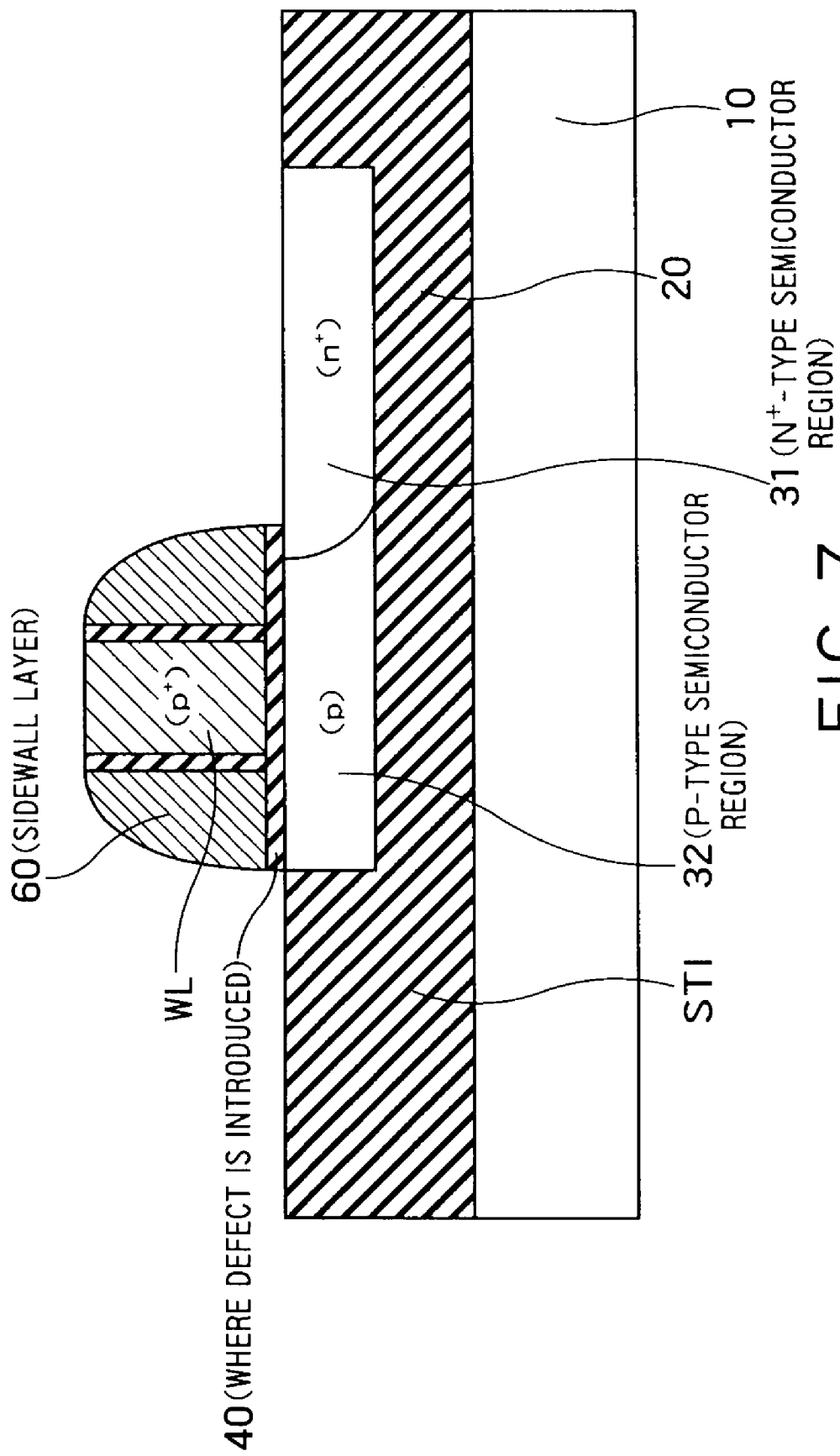

Thereafter, the lithograph and the RIE are used to process the word-line material 45 as shown in FIG. 6. Thereby, a $p^+$-type word line WL is formed. This is followed by thermal oxidization applied to the top surface and the side surface of the word line WL, thereby forming a thin silicon oxide film 80 as a protection film.

A side-wall-layer material is then deposited on the word line WL, the SOI layer 30, and the STI. When the side-wall-layer material is anisotropically etched back, a side-wall layer 60 is formed in a manner to face the side surface of the word line WL. The side-wall layer 60 can be a single film (for example, a silicon-nitride-film single body). Alternatively, the side-wall layer 60 can be a laminated film made of a plurality of types of materials (for example, a composite film of a silicon oxide film and a silicon nitride film).

Subsequently, the word line WL and the side-wall layer 60 are used as a mask, and in this state, n-type impurities (for example, phosphorus or arsenic) are ion-implanted into the SOI layer 30. As a result of a thermal process being applied, the $n^+$-type first semiconductor region 31 is formed to be adjacent to the p-type second semiconductor region 32. The $n^+$-type first semiconductor region 31 can be formed in a self-aligned manner, without using lithography. At this time, the pn junction between the semiconductor region 31 and the semiconductor region 32 must not be diffused to reach beneath the word line WL. The reason for this is to allow the pn junction to fully demonstrate the protection function of the capacitor, as stated above. The n-type impurities implanted in the first semiconductor region 31 so that the pn junction is not diffused to reach beneath the word line WL is preferably arsenic rather than phosphorus. The side-wall-layer material is preferably deposited thickly so that the side-wall layer 60 is formed thickly on the side surface of the word line WL. For example, the deposition film thickness of the side-wall-layer material preferably is comparable to or more than that of the word-line material 45. The n-type impurities implanted in the semiconductor region 31 are implanted also to the word line WL at the same time. However, the $p^+$-type impurity concentration of the word line WL is sufficiently heavily doped, and thus, the word line WL still maintains p-type inductivity.

Figure 8:
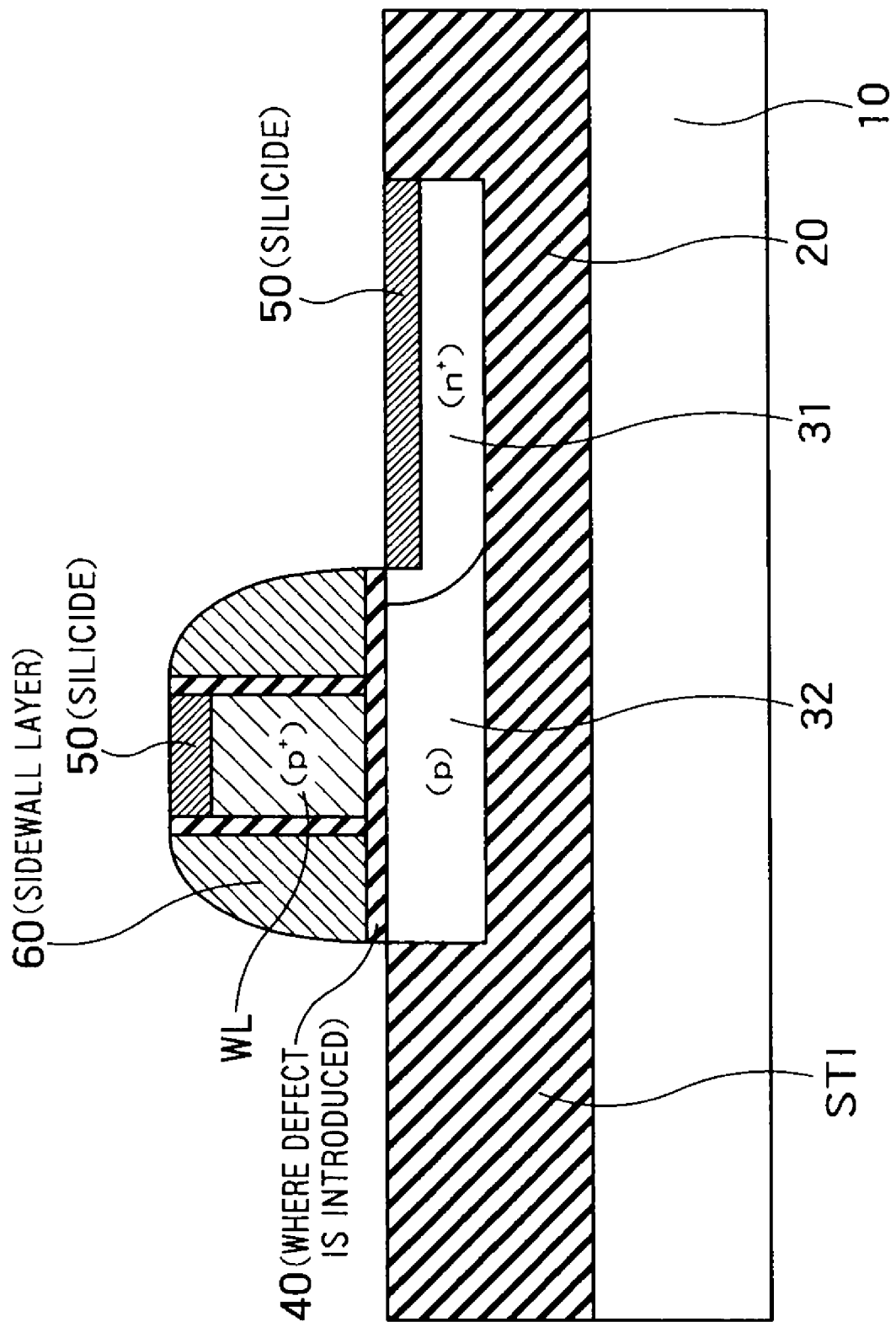

Next, as shown in FIG. 8, the silicide 50 is formed on the word line WL and the first semiconductor region 31. The silicide 50 is nickel silicide, for example. The silicide 50 is formed in a self-aligned manner only on the top surface of the exposed word line WL and on the first semiconductor region 31.

This is followed by the formation of the barrier film 70, the interlayer dielectric film ILD, the bit line contact BLC, and a metal wire by using a well-known technique. Thereby, a cross-sectional structure shown in FIG. 2 is obtained.

As described above, the insulating-film breakdown ROM according to the first embodiment can be manufactured by using a planar CMOS process technique. Accordingly, the insulating-film breakdown ROM according to the first embodiment becomes less expensive in manufacturing cost than the conventional vertical structure. Each memory cell MC according to the first embodiment is constituted by one capacitor and one diode. Accordingly, the present invention is superior in miniaturization to the insulating-film breakdown ROM using the conventional planar device. As a result, the insulating-film breakdown ROM according to the first embodiment can be manufactured in a smaller size and more economically while using the planar device.

Second Embodiment

Figure 9:
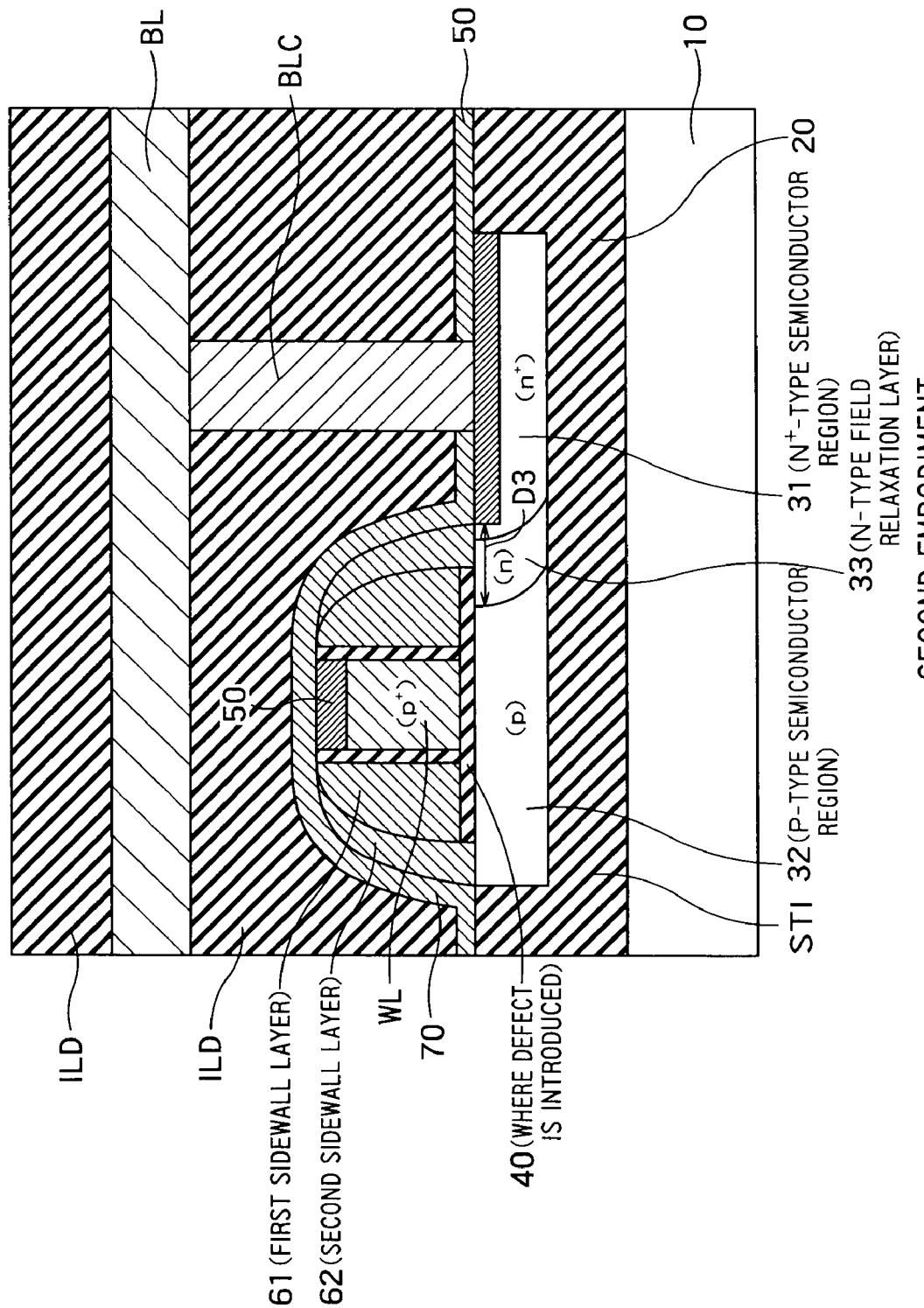
FIG. 9 is a cross-sectional view of an insulating-film breakdown ROM according to a second embodiment of the present invention.

FIG. 9 is a cross-sectional view of an insulating-film breakdown ROM according to a second embodiment of the present invention. The second embodiment differs from the first embodiment in that between the first semiconductor region 31 and the second semiconductor region 32, an n-type field relaxation layer 33 is further provided. The field relaxation layer 33 has an n-type impurity concentration lower than the impurity concentration of the n$^+$-type first semiconductor region 31.

Both the impurities introduced to the field relaxation layer 33 and the first semiconductor region 31 can be the same n-type impurities, and can also be n-type impurities different from each other. For example, the impurities introduced into the field relaxation layer 33 and the first semiconductor region 31 can be: arsenic and arsenic; phosphorus and phosphorus; arsenic and phosphorus, or phosphorus and arsenic, respectively.

To form the field relaxation layer 33 and the first semiconductor region 31, the side wall of the word line WL is formed with a first side-wall layer 61 and a second side-wall layer 62. As described later, the field relaxation layer 33 is formed in a self-aligned manner by ion-implanting n-type impurities by using, as a mask, the first side-wall layer 61 closer to the word line WL than the second side-wall layer 62. The silicide 50 on the first semiconductor region 31 is formed in a self-aligned manner by using, as a mask, the second side-wall layer 62.

Figure 10:
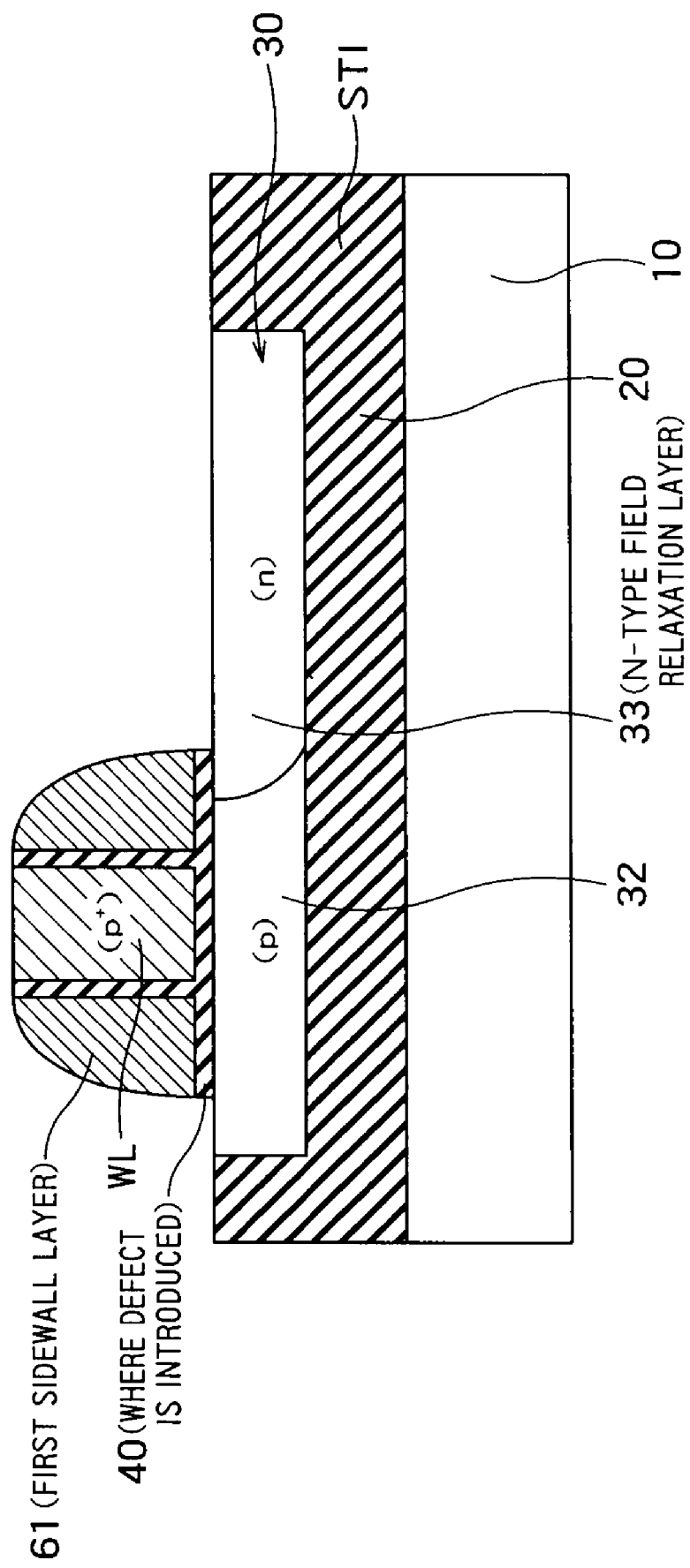
FIG. 10 and FIG. 11 are cross-sectional views each showing the manufacturing method of the insulating-film breakdown ROM according to the second embodiment.

A manufacturing method according to the second embodiment is described next. First, as stated above with reference to FIG. 4 to FIG. 6, the SOI layer 30, the word line WL, and the like, are processed. Subsequently, as shown in FIG. 10, a first side-wall-layer material is deposited on the word line WL, the SOI layer 30, and the STI. When the first side-wall layer material is anisotropically etched back, the first side-wall layer 61 is formed to face the side surface of the word line WL. The first side-wall layer 61 can be a single film (for example, a silicon-nitride-film single body). Alternatively, the first side-wall layer 61 can be a laminated film made of a plurality of types of materials (for example, a composite film of a silicon oxide film and a silicon nitride film).

Next, the word line WL and the first side-wall layer 61 are used as a mask to ion-implant n-type impurities (for example, phosphorus or arsenic) into the SOI layer 30. As a result of a thermal process being applied, the n-type field relaxation layer 33 is formed to be adjacent to the p-type second semiconductor region 32. The n-type field relaxation layer 33 can be formed in a self-aligned manner, without using lithography. At this time, the pn junction between the field relaxation layer 33 and the semiconductor region 32 must not be diffused to reach immediately beneath the word line WL. The reason for this is to allow the protection function of the capacitor by the pn junction to fully demonstrate.

Figure 11:
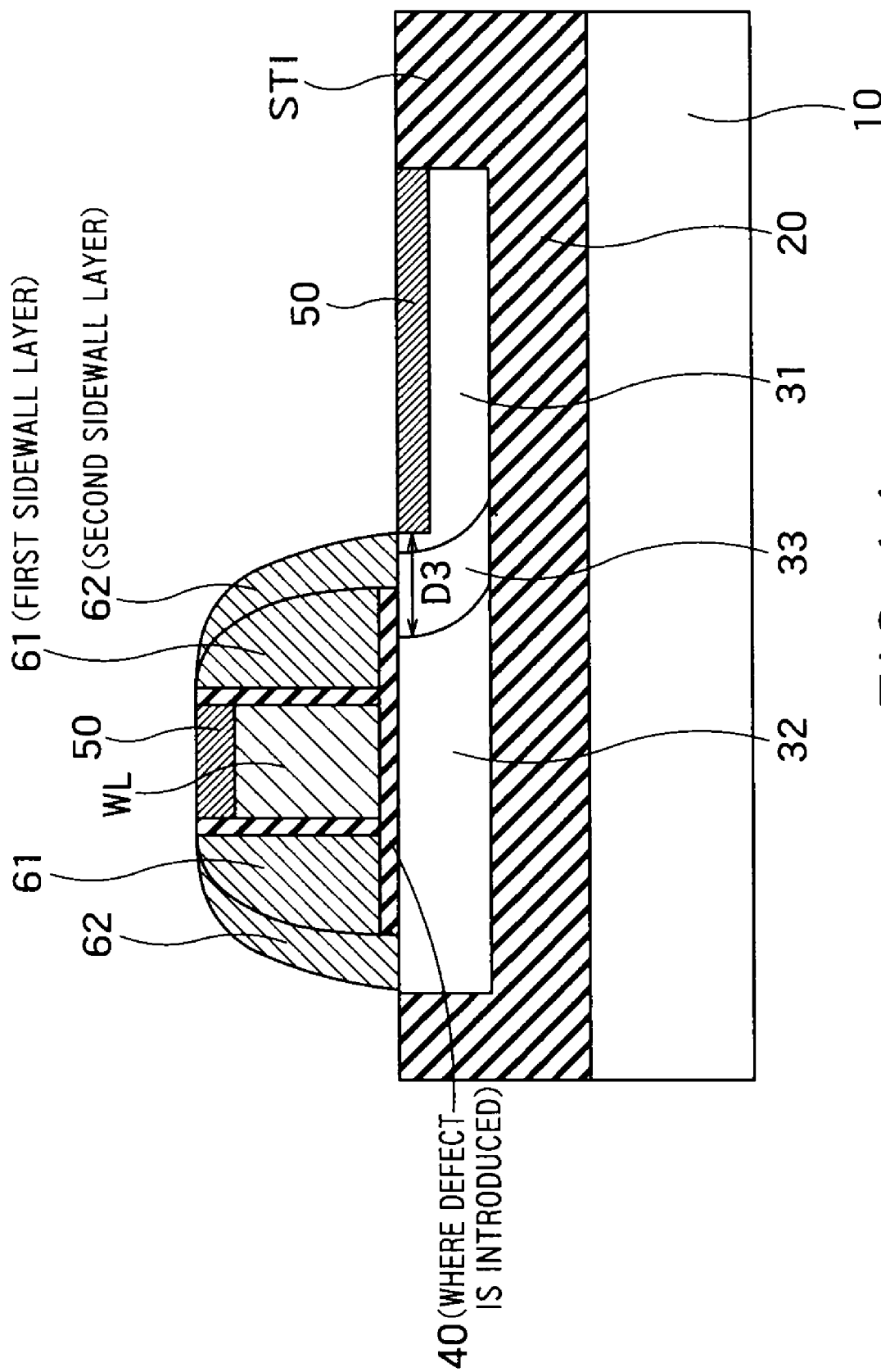

Subsequently, as shown in FIG. 11, a second side-wall-layer material is deposited on the word line WL, the first side-wall layer 61, the SOI layer 30, and the STI. When the second side-wall-layer material is etched back anisotropically, the second side-wall layer 62 is formed to coat the outer surface of the first side-wall layer 61. The second side-wall layer 62 can be a single film (for example, a silicon-nitride-film single body). Alternatively, the second side-wall layer 62 can be a laminated film made of a plurality of types of materials (for example, a composite film of a silicon oxide film and a silicon nitride film).

Subsequently, the word line WL and the second side-wall layer 62 are used as a mask to ion-implant n-type impurities (for example, phosphorus or arsenic) in the SOI layer 30. As a result of a thermal process being applied, the n$^+$-type first semiconductor region 31 is formed within the field relaxation layer 33. The n$^+$-type first semiconductor region 31 can be formed in a self-aligned manner, without using lithography. At this time, the first semiconductor region 31 must not be diffused beyond the field relaxation layer 33 to reach the second semiconductor region 32. The reason for this is to allow the field relaxation layer 33 to effectively function. The silicide 50 may then be subsequently formed.

This is followed, similarly to the manufacturing method of the first embodiment, by the formation of the barrier film 70, the interlayer dielectric film ILD, the bit line contact BLC, and the metal wire. Thereby, the configuration by the second embodiment can be obtained.

Thus, in the second embodiment, the first side-wall layer 61 relatively close to the word line WL is used to form the field relaxation layer 33, and the second side-wall layer 62 relatively far from the word line WL is used to form the silicide 50 on the first semiconductor region 31. Thereby, a distance D3 from the silicide 50 on the first semiconductor region 31 to the p-type second semiconductor region 32 becomes larger than the D1 shown in FIG. 2. That is, the distance D3 from the silicide 50 on the first semiconductor region 31 to the pn junction between the field relaxation layer 33 and the second semiconductor region 32 becomes larger than D1. When the distance D3 becomes greater, a depleted layer extending from the pn junction is prevented from reaching the silicide 50. As a result, a leakage current of the pn junction by punch-through can be inhibited.

Other parts of the configuration of the second embodiment can be identical to the configuration of the first embodiment. Accordingly, the second embodiment can also achieve effects of the first embodiment.

Third Embodiment

Figure 12:
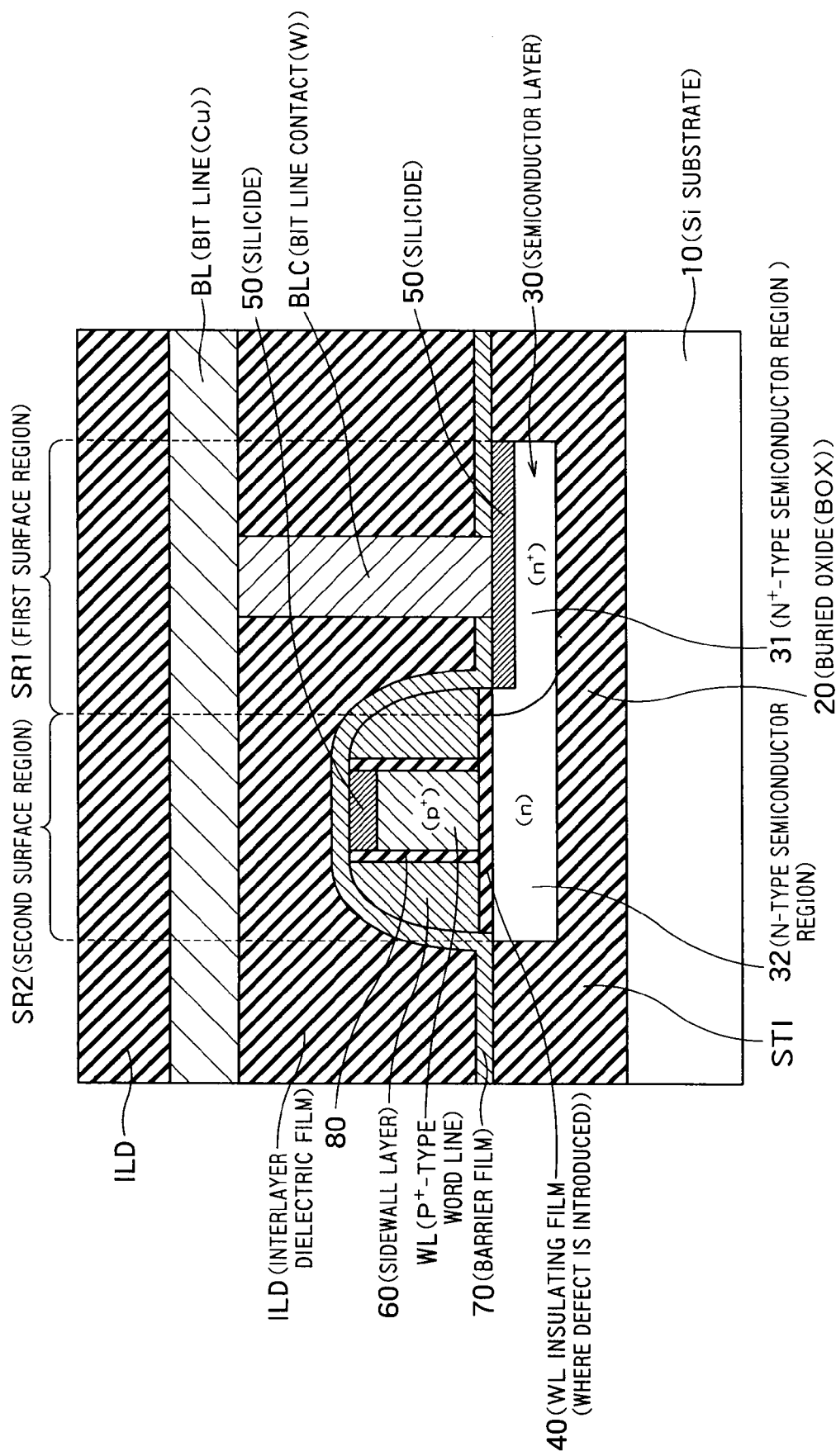
FIG. 12 is a cross-sectional view of an insulating-film breakdown ROM according to a third embodiment of the present invention.

FIG. 12 is a cross-sectional view of an insulating-film breakdown ROM according to a third embodiment of the present invention. The third embodiment differs from the first embodiment in that the second semiconductor region 32 is an n-type semiconductor. Other parts of the configuration of the third embodiment can be identical to the configuration of the first embodiment.

When the second semiconductor region 32 is the n-type semiconductor, no pn junction is formed between the first semiconductor region 31 and the second semiconductor region 32. That is, each memory cell MC does not include a diode and is constituted only by a MOS capacitor.

Figure 13:
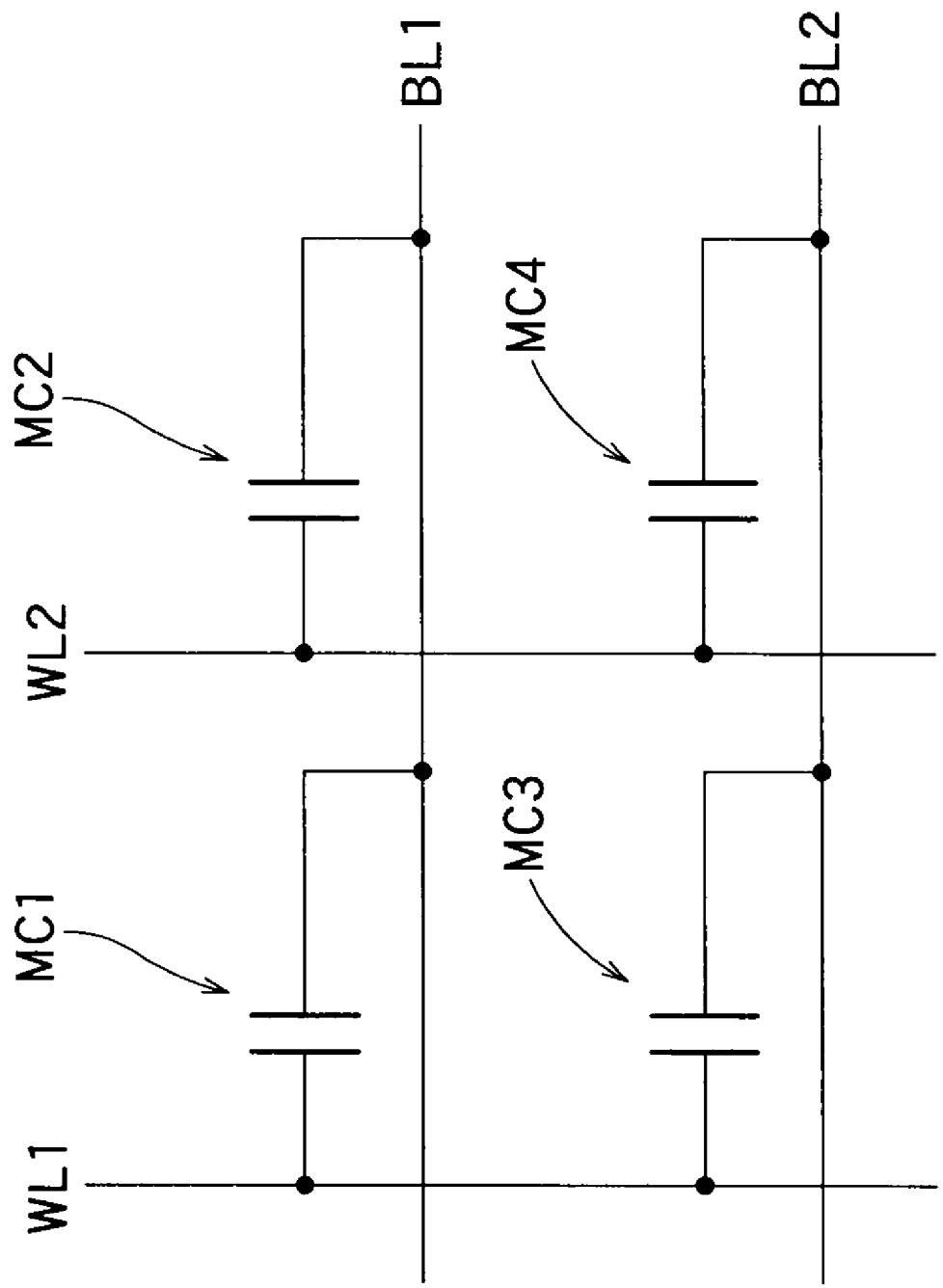
FIG. 13 is an equivalent circuit diagram showing the four memory cells MC1 to MC4 by the third embodiment.

FIG. 13 is an equivalent circuit diagram showing the four memory cells MC1 to MC4 by the third embodiment. In the third embodiment, the MOS capacitor only is connected between the word line and the bit line, and the diode is not arranged. In such a mode, potentials of three levels become necessary as voltage applied to the word line and the bit line at the time of programming. That is, at the time of programming, a high-level potential Vp, a low-level potential V0, or an intermediate-level potential Vm is applied to the word line and the bit line. The intermediate-level potential Vm is a potential at an intermediate level between Vp and V0. Potential differences (Vm−V0) and (Vp−Vm) are those which do not break the MOS capacitor of each memory cell MC1 to MC4. In other words, the MOS capacitor is formed not to be broken by the potential differences (Vm−V0) and (Vp−Vm) but to be broken by the potential difference (Vp−V0).

For example, when the MOS capacitor of the memory cell MC2 is selectively broken, the low-level potential V0 is applied to the bit line BL1 and the high-level potential Vp is applied to the word line WL2. To the other non-selected word lines WL1 and non-selected bit lines BL2, the intermediate-level potential Vm is applied.

At this time, the MOS capacitor of the memory cell MC2 is applied the potential difference (Vp−V0). Accordingly, the MOS capacitor of the memory cell MC2 is broken. On the other hand, the MOS capacitors of the memory cells MC1, MC3, and MC4 are supplied with the potential differences (Vm−V0), 0, and (Vp−Vm), respectively. Accordingly, the respective MOS capacitors of the memory cells MC1, MC3, and MC4 are not broken.

Thus, although in the third embodiment, no diode is arranged, the desired memory cell MC can be selectively blown. Thus, it is possible to function as the insulating-film breakdown ROM. The insulating-film breakdown ROM according to the third embodiment can be manufactured by using a planar CMOS process technique. Accordingly, in the insulating-film breakdown ROM according to the third embodiment, the manufacturing cost becomes lower than that of the conventional vertical structure. Further, each memory cell MC according to the third embodiment is constituted by one capacitor. Accordingly, the insulating-film breakdown ROM according to the third embodiment is superior in miniaturization to that using the conventional planar device. As a result, the insulating-film breakdown ROM according to the third embodiment can be manufactured more compactly and also more economically while using a planar device.

Fourth Embodiment

Figure 14:
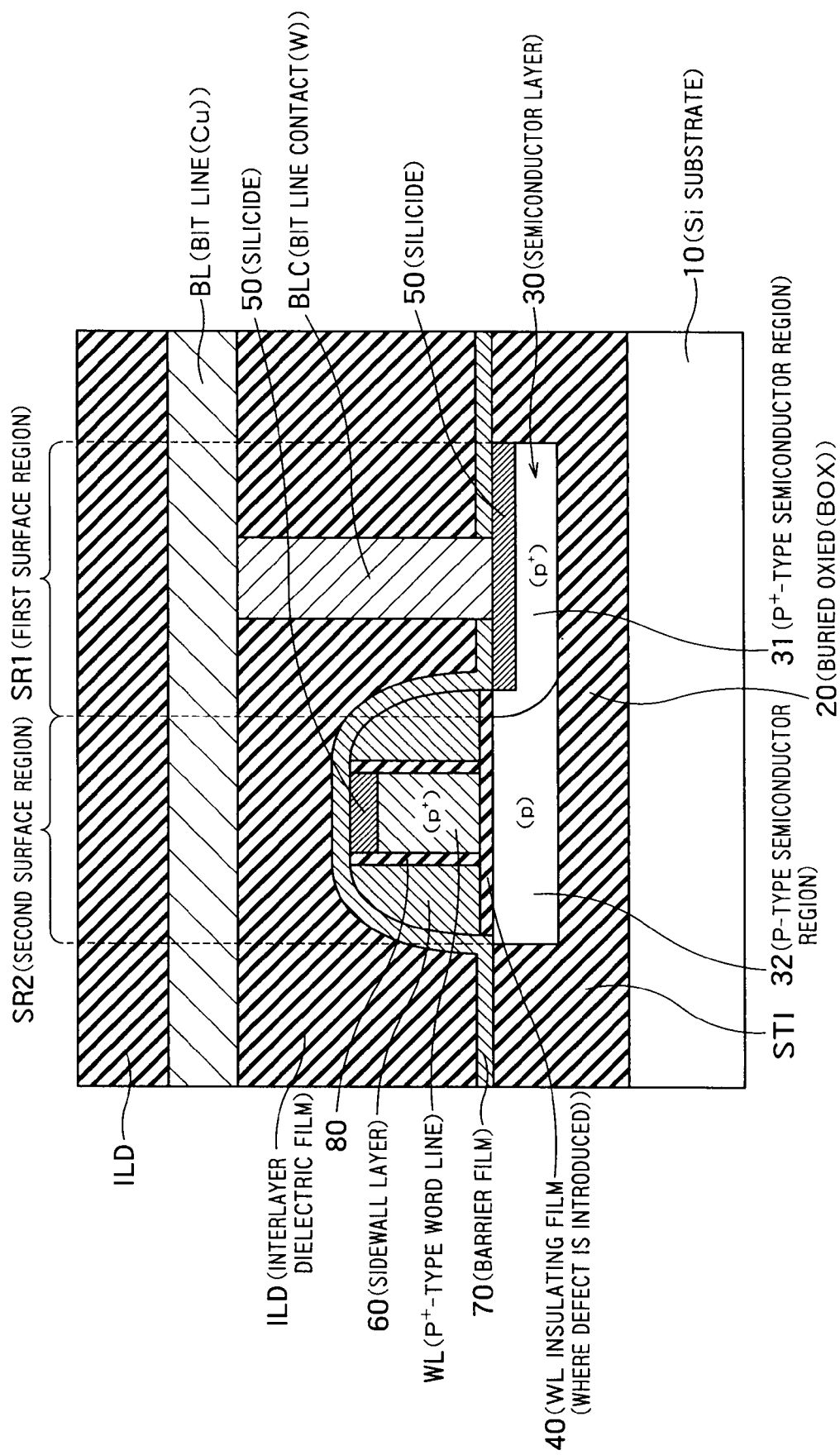
FIG. 14 is a cross-sectional view of an insulating-film breakdown ROM according to a fourth embodiment of the present invention.

FIG. 14 is a cross-sectional view of an insulating-film breakdown ROM according to a fourth embodiment of the present invention. The fourth embodiment differs from the first embodiment in that the first semiconductor region 31 is a $p^+$-type semiconductor. Other parts of the configuration of the fourth embodiment can be identical to the configuration of the first embodiment.

When the first semiconductor region 31 is the $p^+$-type semiconductor, no pn junction is formed between the first semiconductor region 31 and the second semiconductor region 32. That is, each memory cell MC does not include the diode, similarly to the third embodiment, and is constituted only by the MOS capacitor. A driving method of the fourth embodiment is identical to that of the third embodiment. Accordingly, the potentials of three levels (Vp, V0, and Vm) are needed as the voltage applied to the word lines and the bit lines at the time of programming.

As in the fourth embodiment, even when both of the first and second semiconductor regions 31 and 32 are the p-type semiconductor, the insulating-film breakdown ROM functions similarly to that of the third embodiment. The fourth embodiment can also achieve effects of the third embodiment.

Fifth Embodiment

Figure 15:
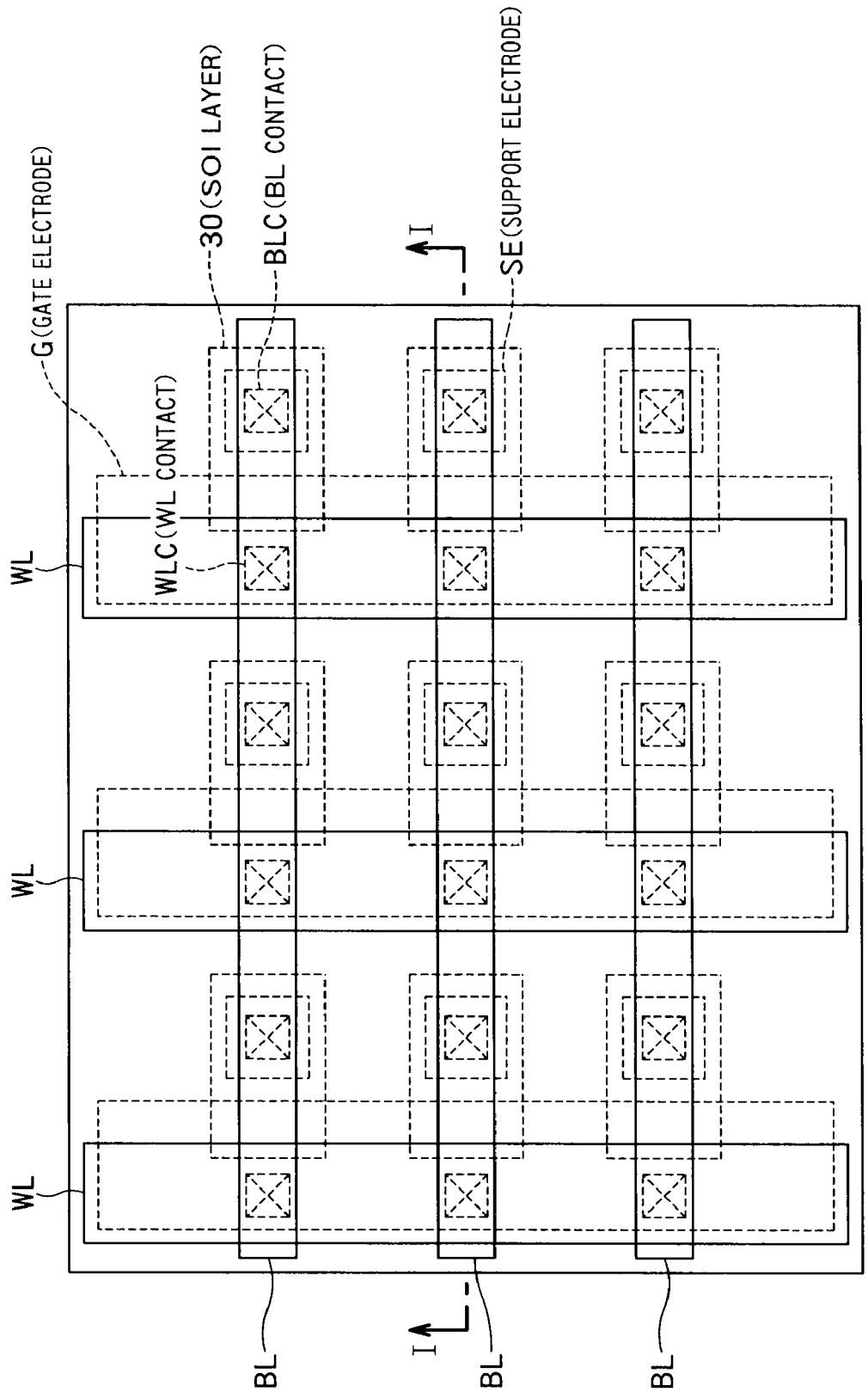
FIG. 15 is a plan view of a cell array region of an insulating-film breakdown ROM according to a fifth embodiment of the present invention.

FIG. 15 is a plan view of a cell array region of an insulating-film breakdown ROM according to a fifth embodiment of the present invention. In the fifth embodiment, the word lines WL are arranged separately of gate electrodes G. Each word line WL is electrically connected to each gate electrode G via each word-line contact WLC. To form the word line WL, a metal layer above the gate electrode G is needed. The metal layer is used to form a supporting electrode SE in a region of the bit line contact BLC. The word lines WL in the first to fourth embodiments correspond to the gate electrode G in the fifth embodiment. In the fifth embodiment, for the sake of convenience, each word line made of lower-layer polysilicon is called a gate electrodes G and each upper-layer metal wire is called a word line WL.

Figure 16:
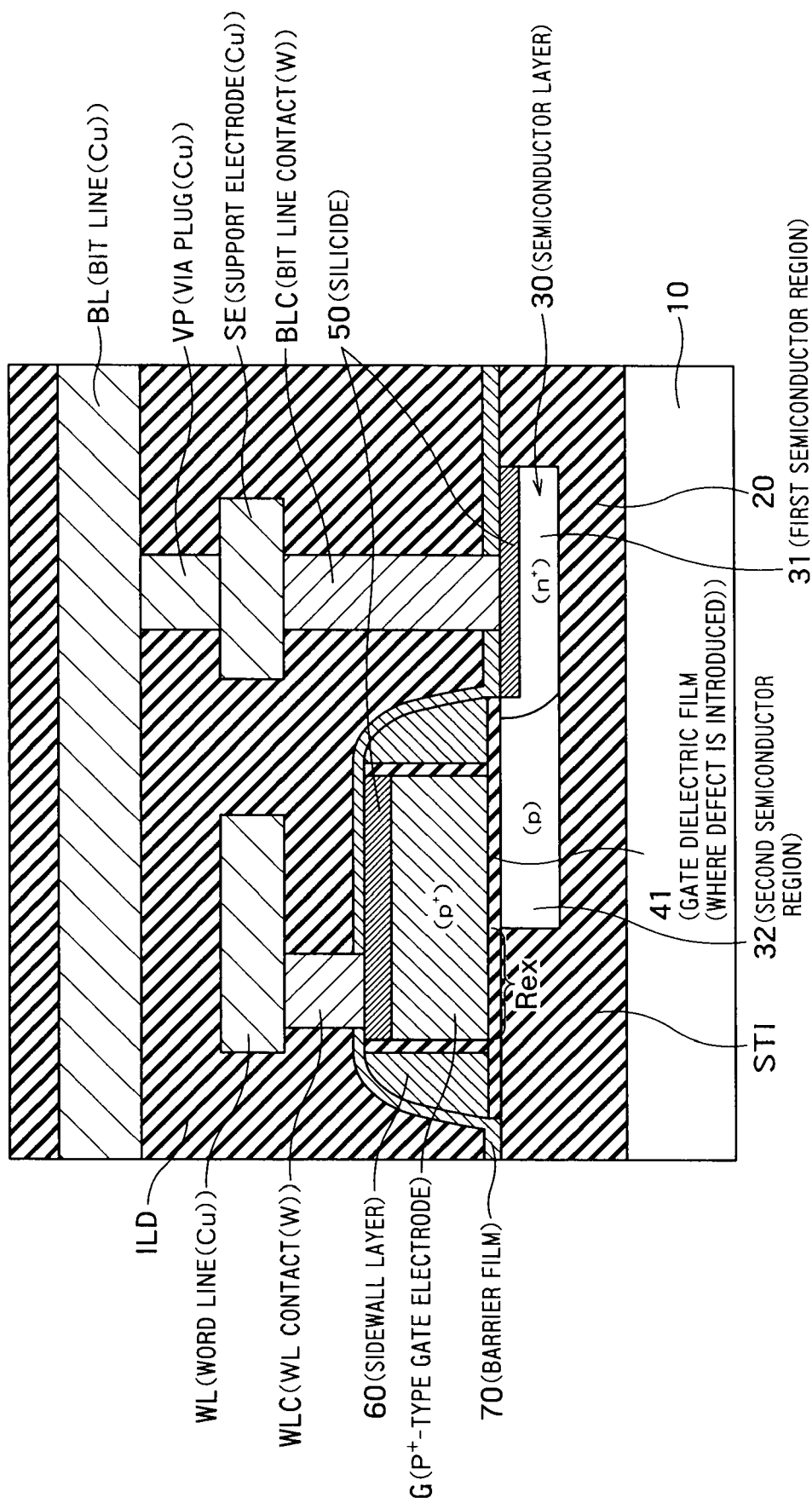
FIG. 16 is a cross-sectional view taken along line I-I in FIG. 15.

FIG. 16 is a cross-sectional view taken along line I-I in FIG. 15. The material of each gate electrode G can be identical to that of each word line WL of the first embodiment. However, the width in a column direction of the gate electrode G is formed to be wider than that of the word line WL of the first embodiment. The gate electrode G has an enlarged region Rex stuck out in the column direction from an edge on the second semiconductor region 32 side of the SOI layer 30. The word-line contact WLC is formed on the enlarged region Rex of the gate electrode G.

Generally, when a contact plug is formed on the gate dielectric film 41, the gate dielectric film 41 is sometimes impaired. Accordingly, in the fifth embodiment, each word-line contact WLC is formed in the enlarged region Rex of the gate electrode G stuck out from the SOI layer 30. Thereby, it becomes possible to inhibit an adverse effect to the gate dielectric film 41.

Each word line WL is electrically connected to each gate electrode G via each word-line contact WLC. Each word line WL extends along the gate electrode G in a row direction. The word line WL is formed of a metal layer such as copper, for example. As shown in FIG. 15, the word-line contact WLC is arranged in each memory cell MC.

At the time of programming, a current sufficient to break the insulating film needs to pass to the gate dielectric film 41. However, when the number of memory cells included in the cell array increases to make the cell array large-scale, if there is only the silicide 50, it is not possible to sufficiently decrease the resistance of the gate electrode (word line). Accordingly, in the fifth embodiment, in addition to the silicide 50 on the gate electrode G, the word line WL as a metal wire is arranged. As a result, since the word line WL is a low resistance, the resistance of the gate electrode G is substantially lowered. When the resistance of the gate electrode (word line) is decreased, the cell array can be made large-scale. That is, the configuration according to the fifth embodiment can be said to be suitable for a large-scale memory cell array.

A manufacturing method of the insulating-film breakdown ROM according to the fifth embodiment is described. At first, with reference to FIG. 4 and FIG. 5, the SOI layer 30 is processed, as stated above, to deposit the gate-electrode material 45. The gate-electrode material 45 can be the same as the word-line material 45.

Figure 17:
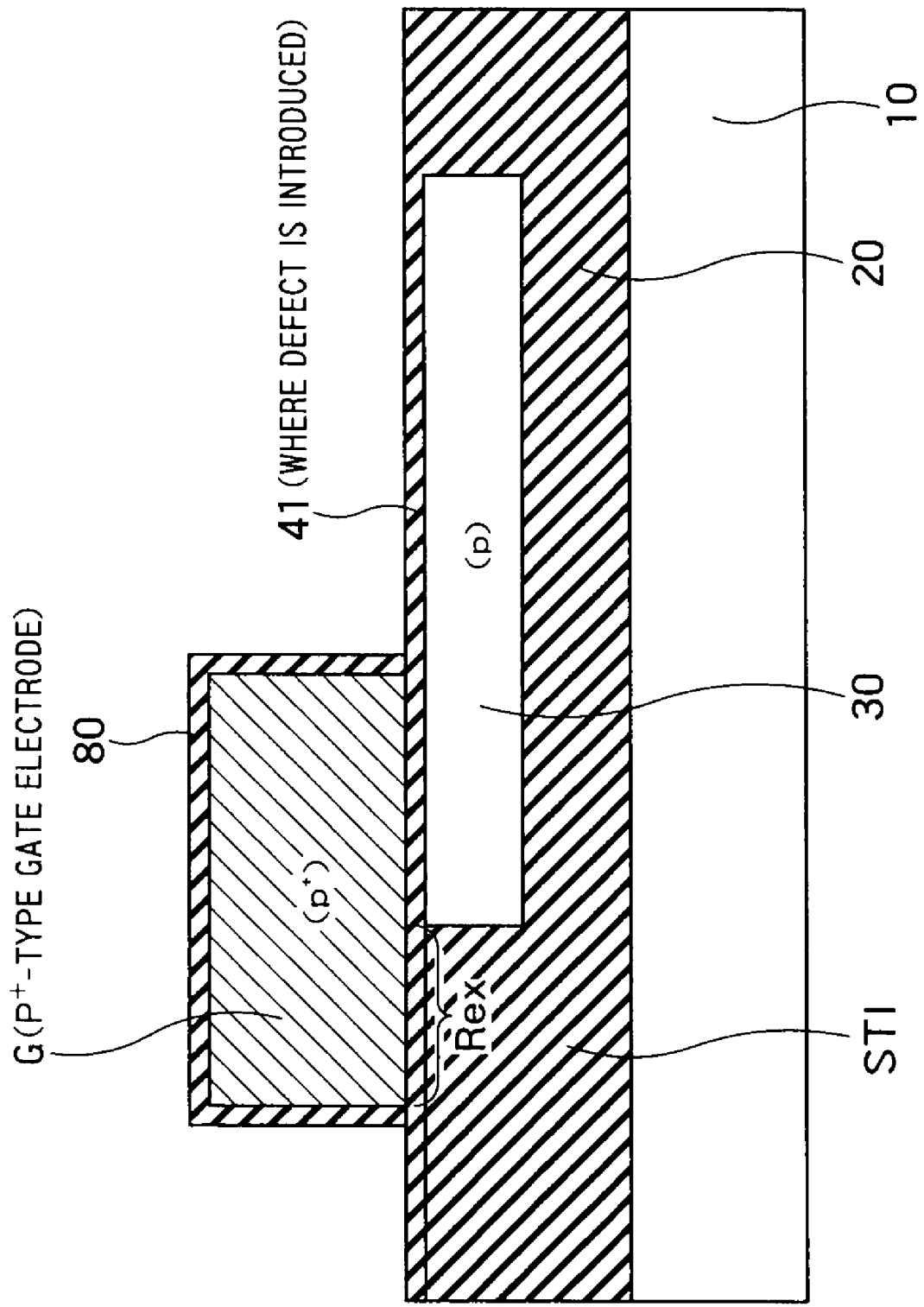
FIGS. 17 to 20 are cross-sectional views each showing the manufacturing method of the insulating-film breakdown ROM according to the fifth embodiment.

Next, as shown in FIG. 17, the gate-electrode material 45 is so processed that the gate electrode G is stuck out in the row direction of one end of the SOI layer 30. Thereby, the enlarged region Rex is formed. This is followed by thermal oxidization of the top surface and the side surface of the gate electrode G to form a thin silicon oxide film 80 as a protection film.

Figure 18:
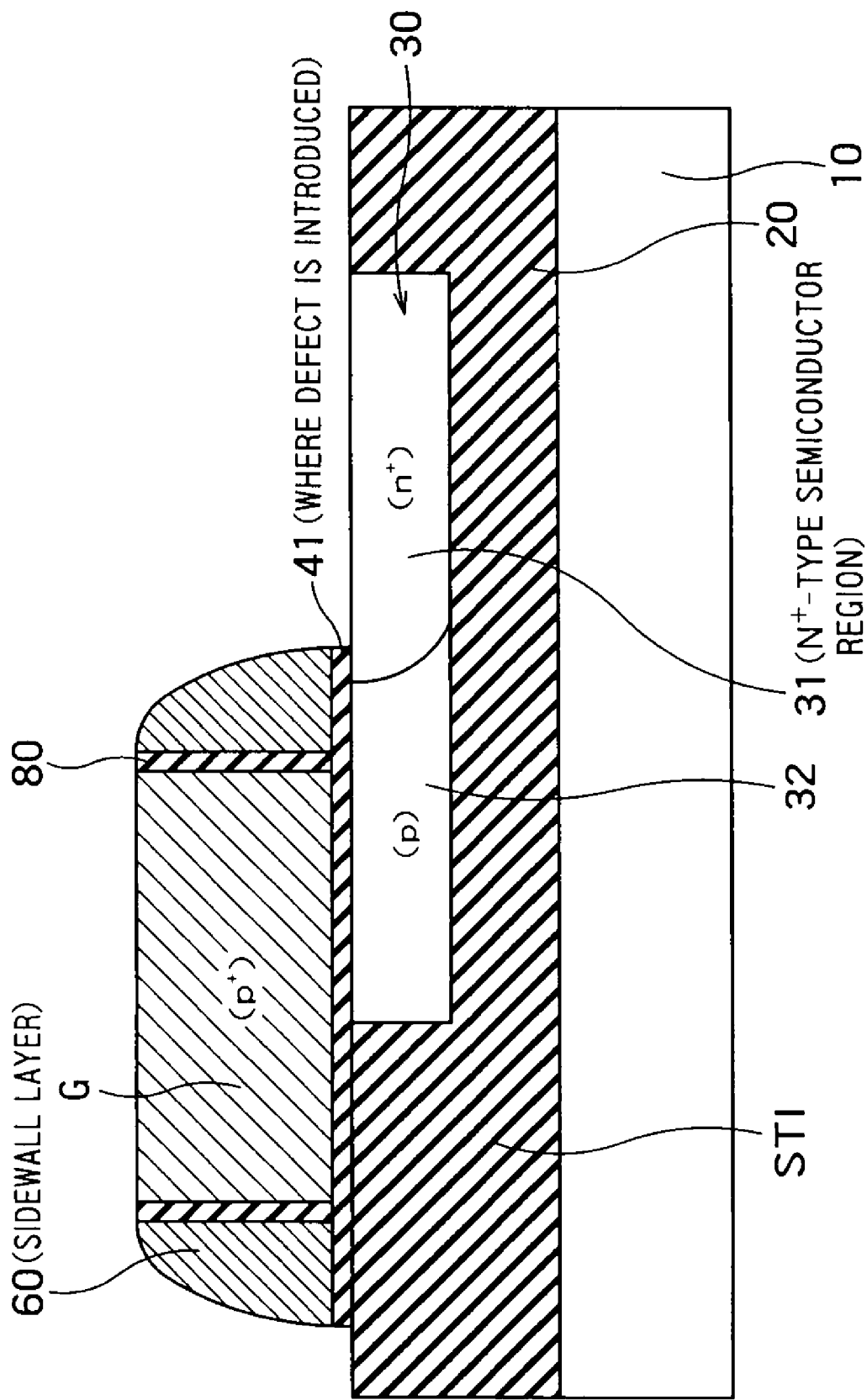

Subsequently, as shown in FIG. 18, the side-wall-layer material is deposited on the gate electrode G, the SOI layer 30, and the STI. When the side-wall-layer material is anisotropically etched back, a side-wall layer 60 is formed in a manner to face the side surface of the gate electrode G. The side-wall layer 60 can be a single film (for example, a silicon-nitride-film single body). Alternatively, the side-wall layer 60 can be a laminated film made of a plurality of types of materials (for example, a composite film of a silicon oxide film and a silicon nitride film).

Next, the gate electrode G and the side-wall layer 60 are used as a mask to ion-implant n-type impurities (for example, phosphorus or arsenic) into the SOI layer 30. As a result of a thermal process being applied, the $n^+$-type first semiconductor region 31 is formed to be adjacent to the p-type second semiconductor region 32. The $n^+$-type first semiconductor region 31 can be formed in a self-aligned manner, without using lithography. At this time, the pn junction between the semiconductor region 31 and the semiconductor region 32 must not be diffused to reach beneath the word line WL.

Figure 19:
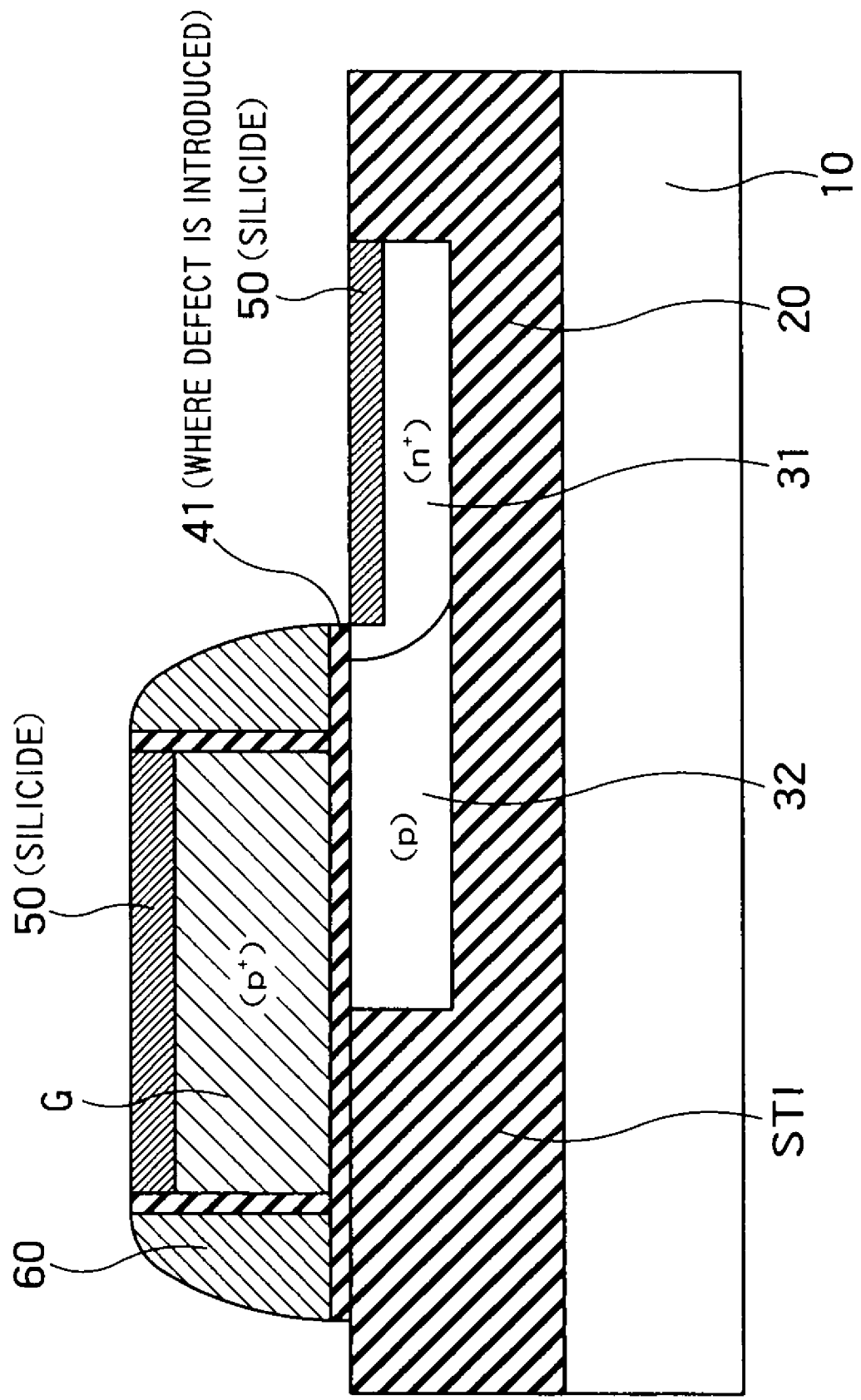

Subsequently, as shown in FIG. 19, the silicide 50 is formed on the word line WL and the first semiconductor region 31. The silicide 50 is nickel silicide, for example. The silicide 50 is formed in a self-aligned manner only on the top surface of the exposed word line WL and on the first semiconductor region 31.

Figure 20:
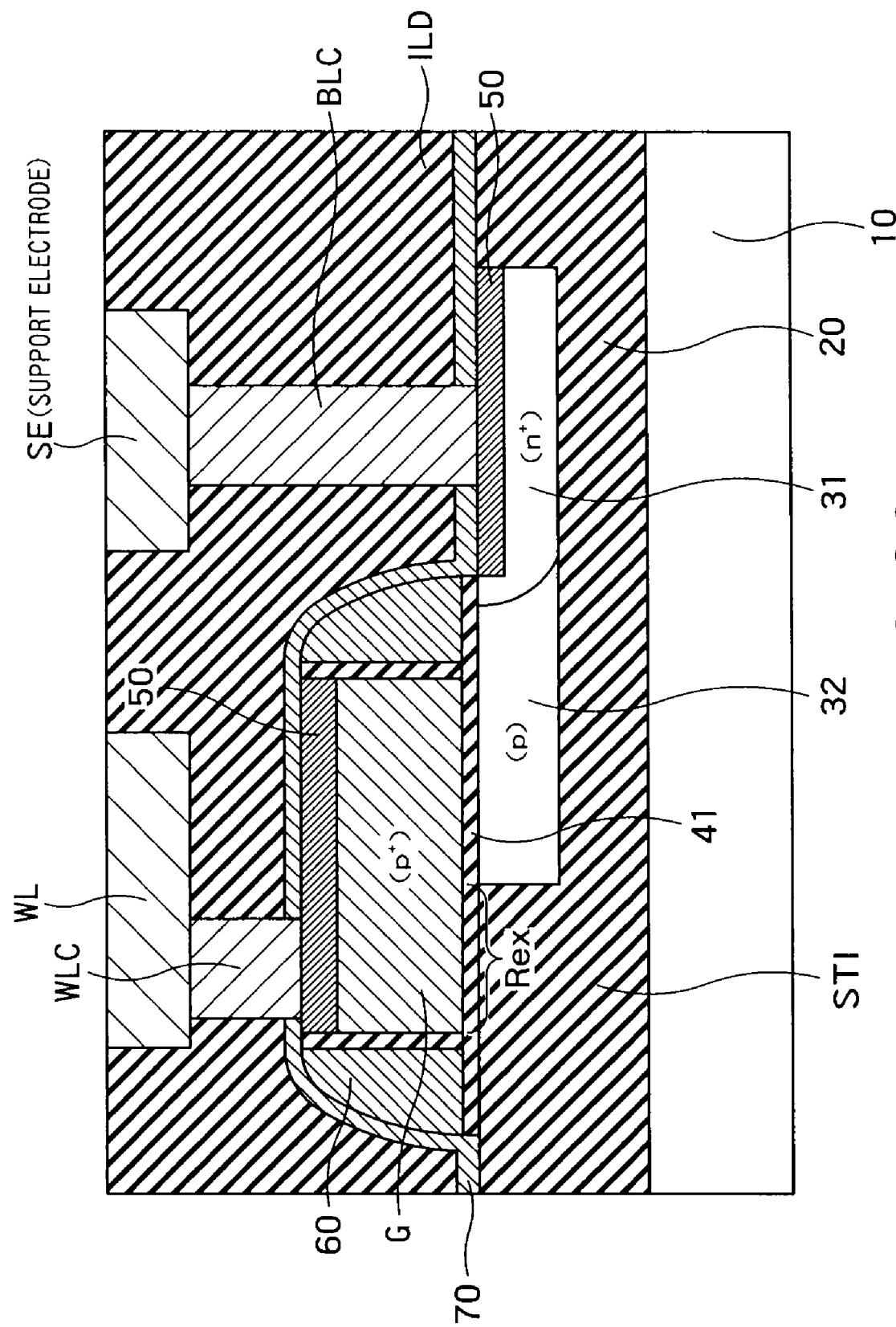

As shown in FIG. 20, after the formation of the barrier film 70, the interlayer dielectric film ILD is deposited on the barrier film 70. The word-line contact WLC and the bit line contact BLC are formed to penetrate the interlayer dielectric film ILD and the barrier film 70. The word-line contact WLC is formed on the enlarged region Rex of the gate electrode G. Thereby, the word-line contact WLC does not adversely affect the gate dielectric film 41. The word-line contact WLC and the bit line contact BLC are made of tungsten, for example, and are formed by a damascene process.

As shown in FIG. 20, the word line WL and the supporting electrode SE are formed by using a damascene process. The material of the word line WL and the supporting electrode SE are copper, for example.

Further, the interlayer dielectric film ILD is deposited to form a via plug VP and the bit line BL. Thereby, a cross-sectional structure shown in FIG. 16 is obtained.

The insulating-film breakdown ROM according to the fifth embodiment is capable of decreasing a gate resistance. As a result, a large-scale cell array constituted by a large number of memory cells MC can be realized. In spite of a large-scale cell array, the size of the memory cell MC itself is small, and thus the dimension of the whole memory device can be small for the cell array scale. Further, the fifth embodiment can also achieve the effects of the first embodiment.

Sixth Embodiment

Figure 21:
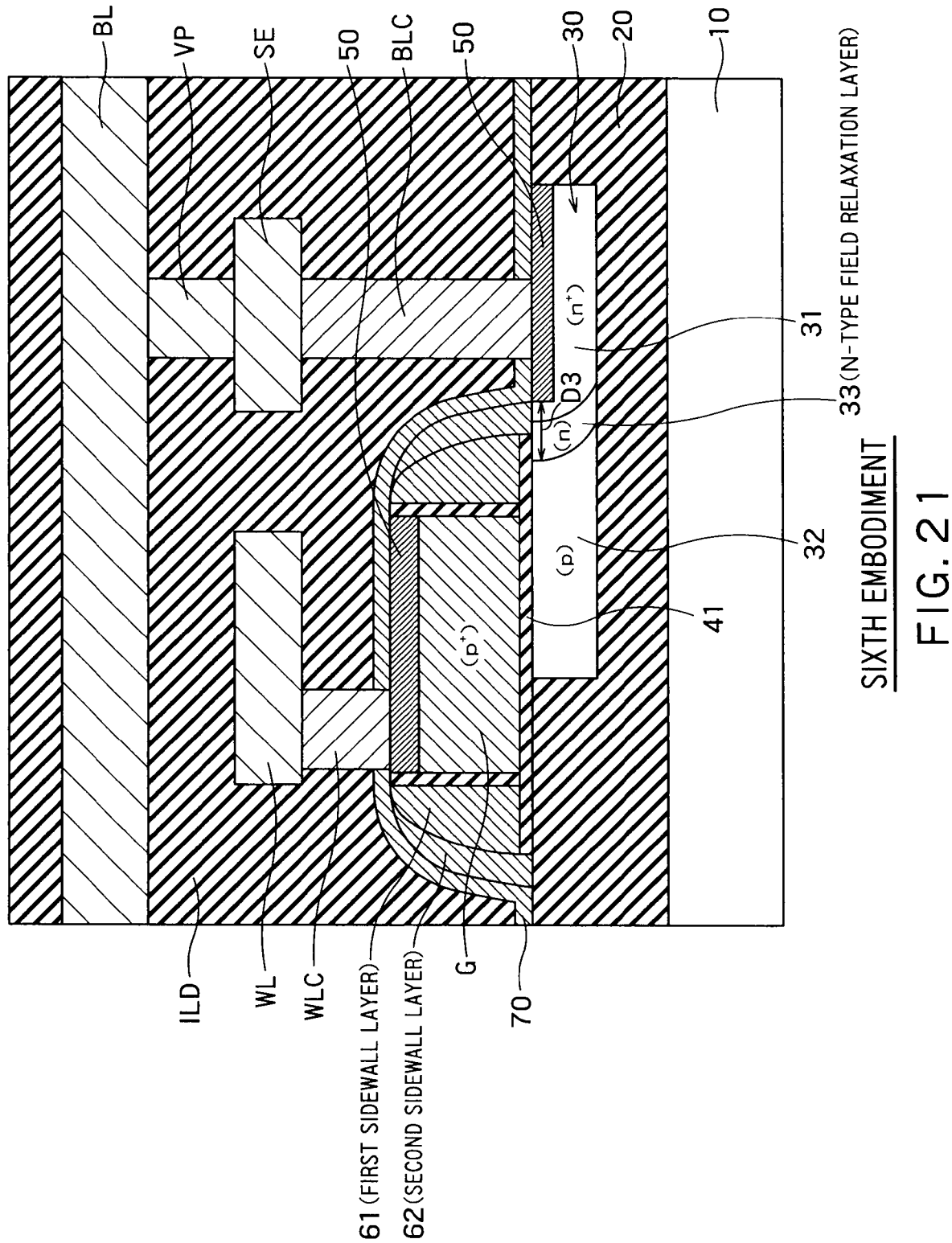
FIG. 21 is a cross-sectional view of an insulating-film breakdown ROM according to a sixth embodiment of the present invention.

FIG. 21 is a cross-sectional view of an insulating-film breakdown ROM according to a sixth embodiment of the present invention. The sixth embodiment differs from the fifth embodiment in that the n-type field relaxation layer 33 is further provided between the first semiconductor region 31 and the second semiconductor region 32. The field relaxation layer 33 has an n-type impurity concentration lower than the impurity concentration of the $n^+$-type first semiconductor region 31. That is, the sixth embodiment is a combination of the second and fifth embodiments. Accordingly, the configurations of the first side-wall layer 61, the second side-wall layer 62, and the field relaxation layer 33, and the manufacturing method thereof can be identical to those of the second embodiment. The configuration of the gate electrode G, the word line WL, the word-line contact WLC, the supporting electrode SE, and the via plug VP, and the manufacturing method thereof can be identical to the configuration and the manufacturing method of the fifth embodiment.

The sixth embodiment achieves effects of both of the second and fifth embodiments. That is, in the insulating-film breakdown ROM according to the sixth embodiment, the cell array can be made large scale and the leakage current of the pn junction by punch-through can be inhibited.

Seventh Embodiment

Figure 22:
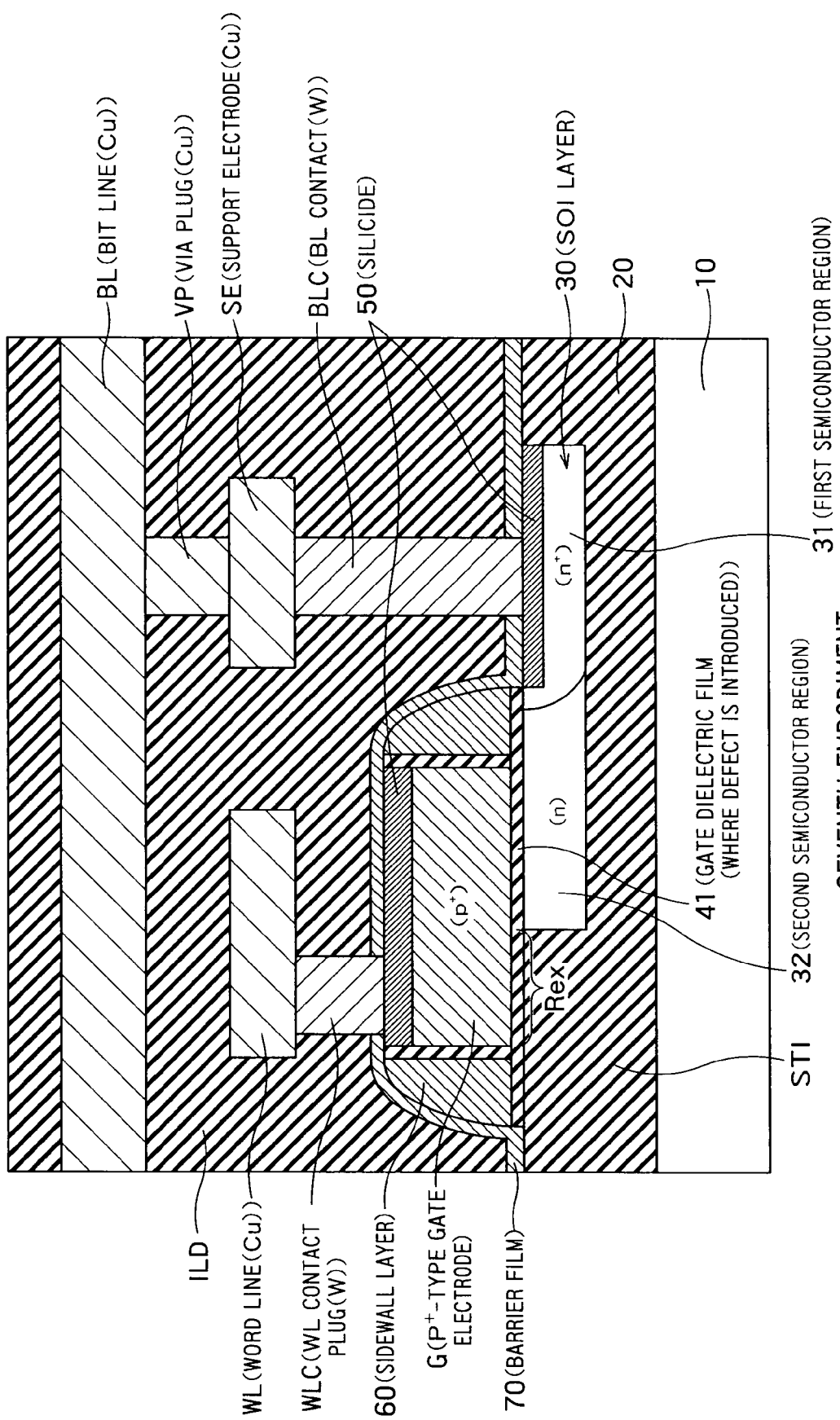
FIG. 22 is a cross-sectional view of an insulating-film breakdown ROM according to a seventh embodiment of the present invention.

FIG. 22 is a cross-sectional view of an insulating-film breakdown ROM according to a seventh embodiment of the present invention. The seventh embodiment differs from the fifth embodiment in that the second semiconductor region 32 is an n-type semiconductor. Other parts of the configuration of the seventh embodiment can be identical to the configuration of the fifth embodiment. That is, the seventh embodiment is a combination of the third and fifth embodiments.

In the seventh embodiment, similarly to the third embodiment, the pn junction is not formed between the first semiconductor region 31 and the second semiconductor region 32. Accordingly, a driving method of the seventh embodiment is identical to that of the third embodiment. The seventh embodiment can achieve effects of both of the third and fifth embodiments.

Eighth Embodiment

Figure 23:
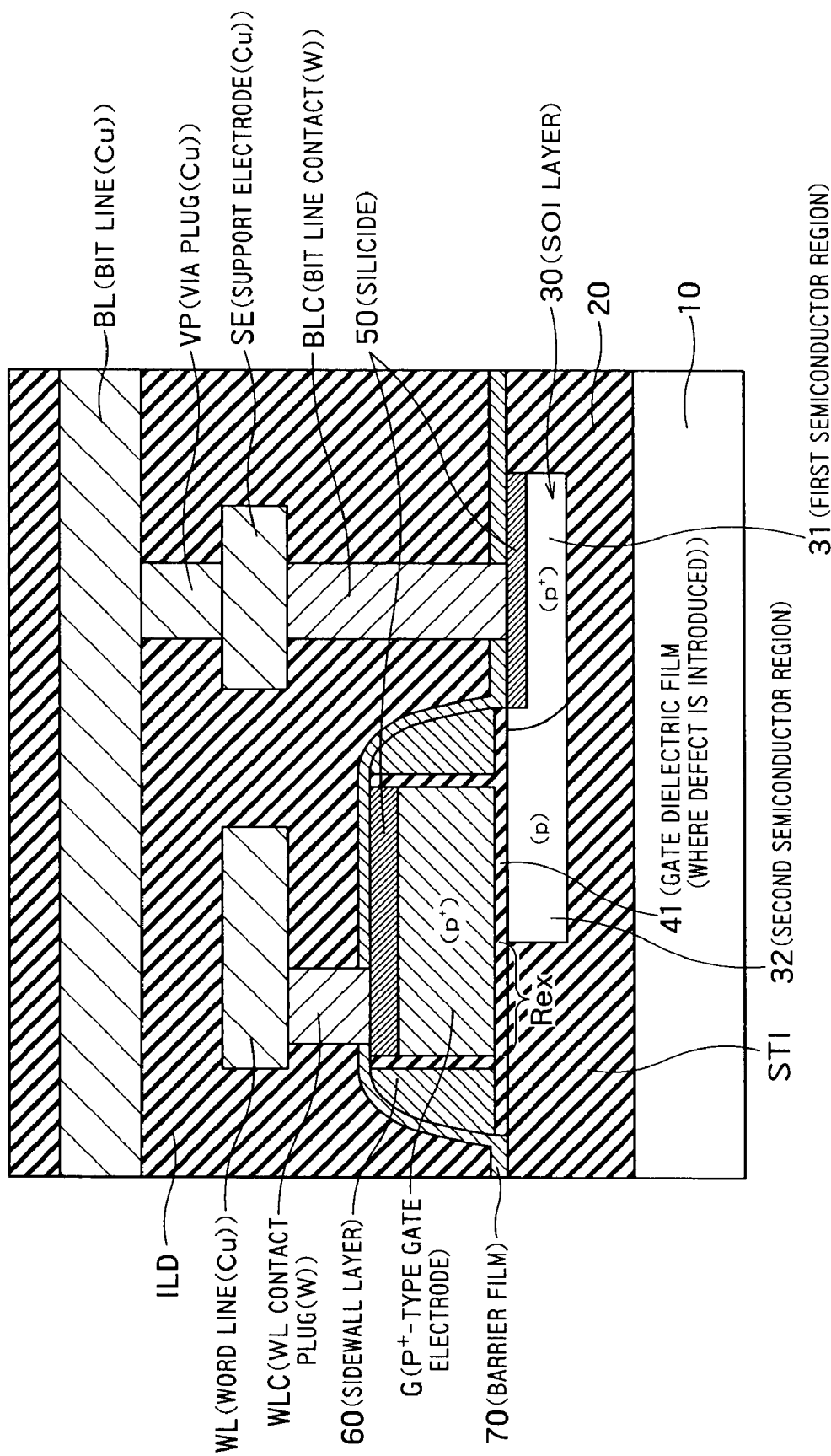
FIG. 23 is a cross-sectional view of an insulating-film breakdown ROM according to an eighth embodiment of the present invention.

FIG. 23 is a cross-sectional view of an insulating-film breakdown ROM according to an eighth embodiment of the present invention. The eighth embodiment differs from the fifth embodiment in that the first semiconductor region 31 is a $p^+$-type semiconductor. Other parts of the configuration of the eighth embodiment can be identical to the configuration of the fifth embodiment. That is, the eighth embodiment is a combination of the fourth and fifth embodiments.

In the eighth embodiment, similarly to the third and fourth embodiments, the pn junction is not formed between the first semiconductor region 31 and the second semiconductor region 32. Accordingly, a driving method of the eighth embodiment is identical to that of the third embodiment. The eighth embodiment achieves effects of both of the fourth and fifth embodiments.

Ninth Embodiment

Figure 24:
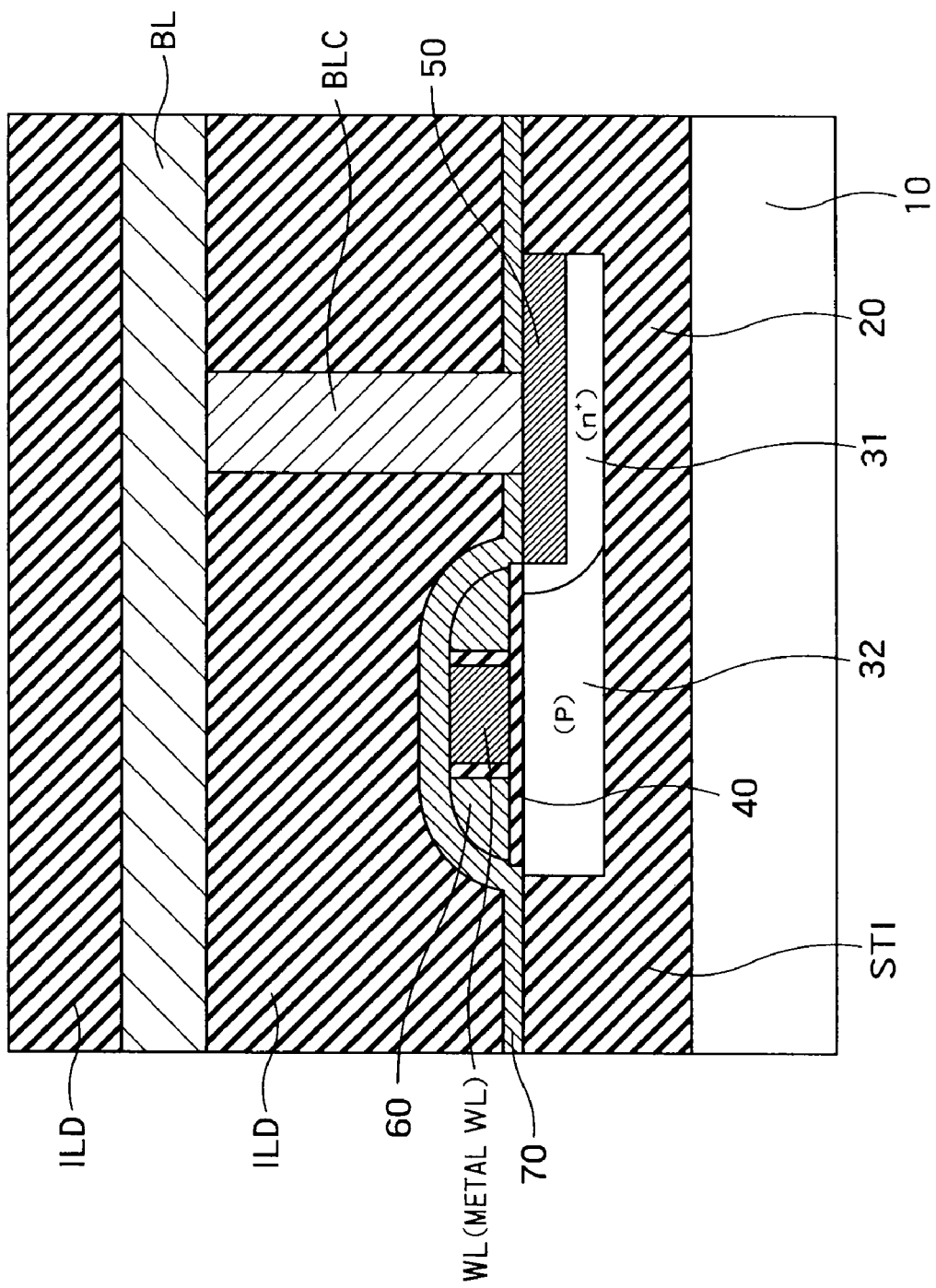
FIG. 24 is a cross-sectional view of an insulating-film breakdown ROM according to a ninth embodiment of the present invention.

FIG. 24 is a cross-sectional view of an insulating-film breakdown ROM according to a ninth embodiment of the present invention. The ninth embodiment differs from the first embodiment in that the entire word line WL is silicided. Other parts of the configuration of the ninth embodiment can be identical to the configuration of the first embodiment. Since the entire word line WL is silicided, the resistance of the word line WL is lowered. Accordingly, in the ninth embodiment, the cell array can be made large scale without forming the gate electrode G and the word line WL individually.

In the insulating-film breakdown ROM according to the ninth embodiment, the polysilicon of the word line WL can be fully silicided in the silicide forming step shown in FIG. 18. Other parts of the manufacturing method according to the ninth embodiment can be identical to the manufacturing method according to the first embodiment.

Tenth Embodiment

Figure 25:
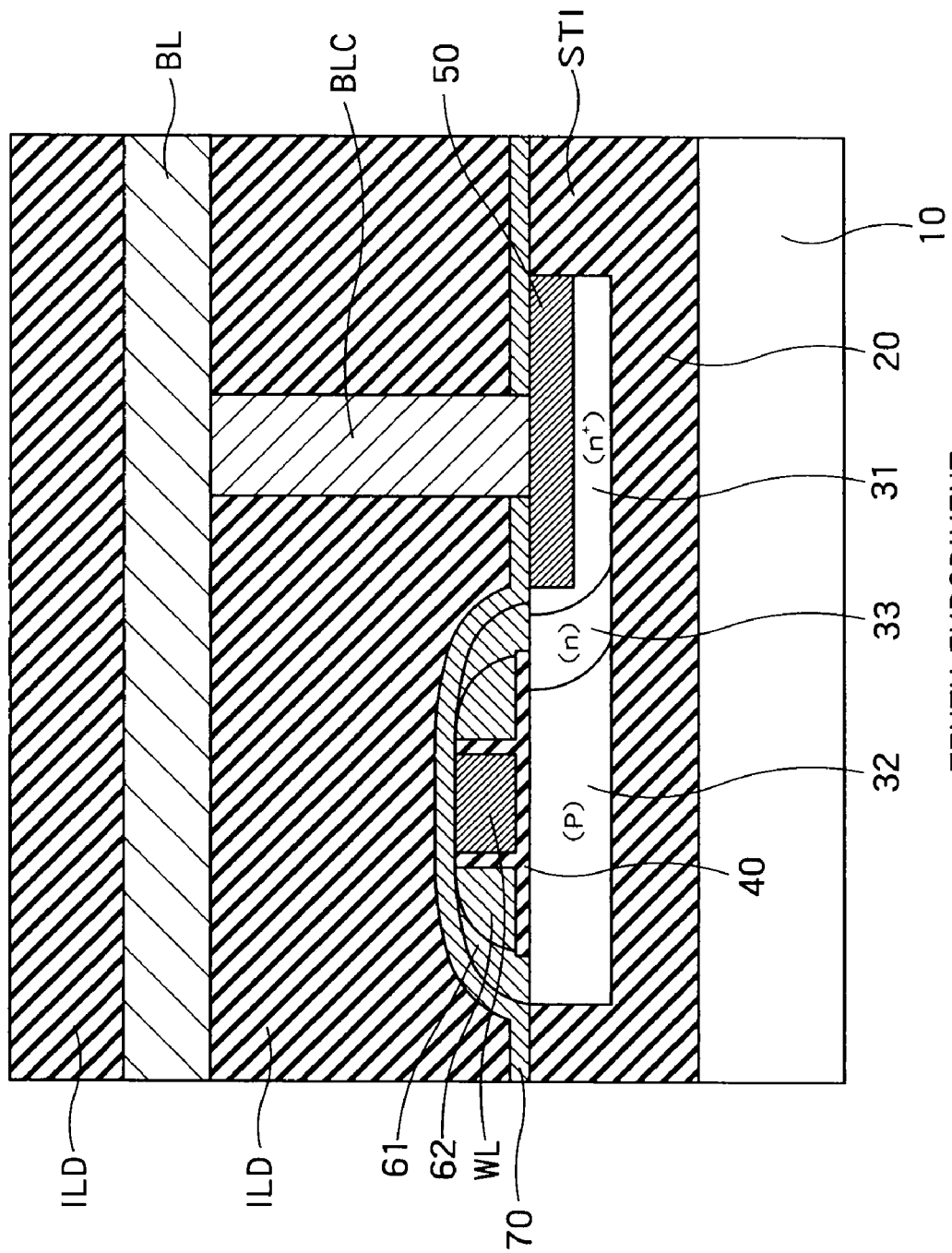
FIG. 25 is a cross-sectional view of an insulating-film breakdown ROM according to a tenth embodiment of the present invention.

FIG. 25 is a cross-sectional view of an insulating-film breakdown ROM according to a tenth embodiment of the present invention. The tenth embodiment differs from the ninth embodiment in that between the first semiconductor region 31 and the second semiconductor region 32, an n-type field relaxation layer 33 is further provided. The tenth embodiment is a combination of the second and ninth embodiments. Accordingly, the configuration of the first side-wall layer 61, the second side-wall layer 62, and the field relaxation layer 33, and the manufacturing method thereof can be identical to those of the second embodiment. The word line WL is fully silicided similar to that in the ninth embodiment. The tenth embodiment achieves effects of both of the second and ninth embodiments.

Eleventh Embodiment

Figure 26:
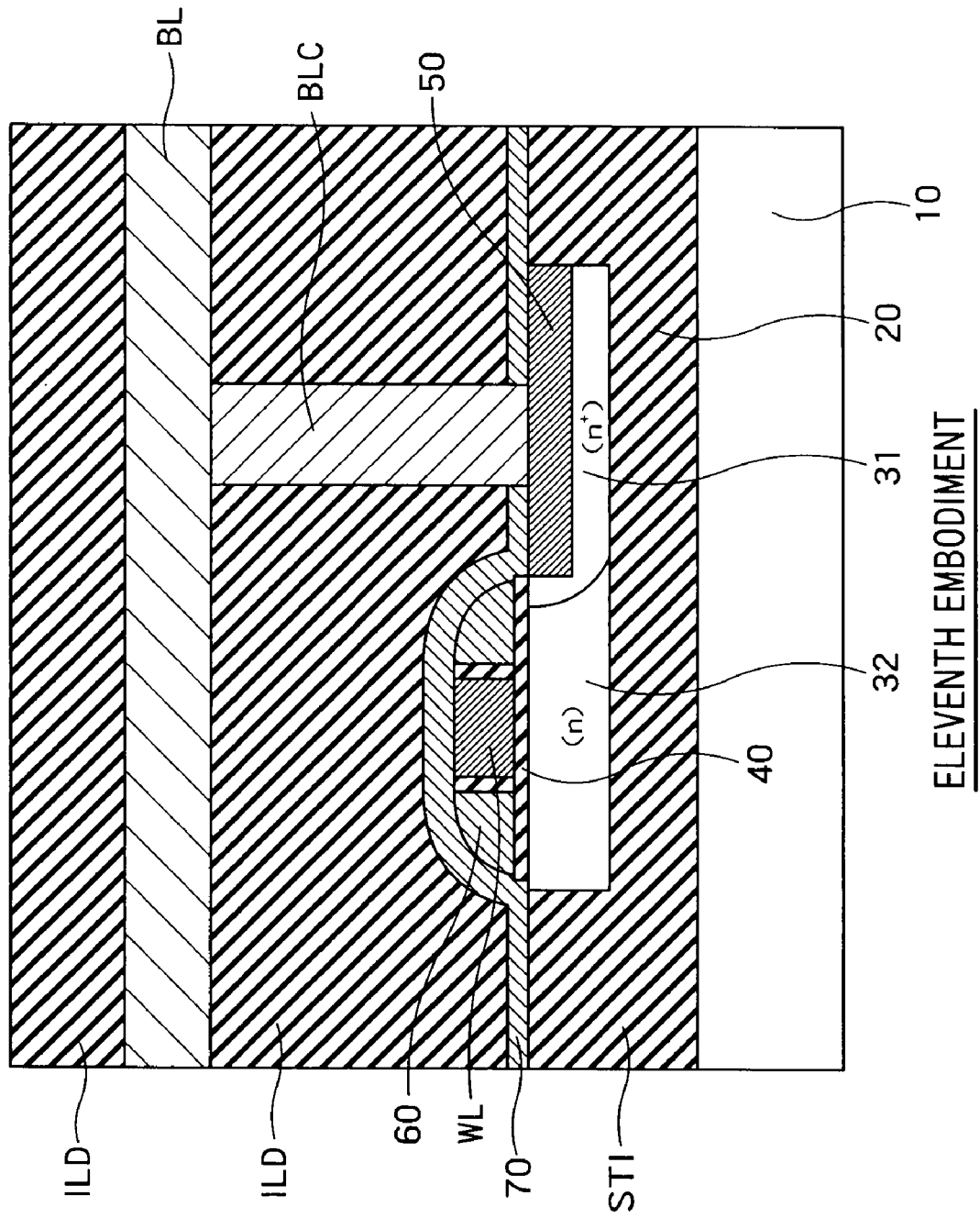
FIG. 26 is a cross-sectional view of an insulating-film breakdown ROM according to an eleventh embodiment of the present invention.

FIG. 26 is a cross-sectional view of an insulating-film breakdown ROM according to an eleventh embodiment of the present invention. The eleventh embodiment differs from the ninth embodiment in that the second semiconductor region 32 is an n-type semiconductor. Other parts of the configuration of the eleventh embodiment can be identical to the configuration of the ninth embodiment. That is, the eleventh embodiment is a combination of the third and ninth embodiments.

In the eleventh embodiment, similarly to the third embodiment, the pn junction is not formed between the first semiconductor region 31 and the second semiconductor region 32. Accordingly, a driving method of the eleventh embodiment is identical to that of the third embodiment. The eleventh embodiment achieves effects of both of the third and ninth embodiments.

Twelfth Embodiment

Figure 27:
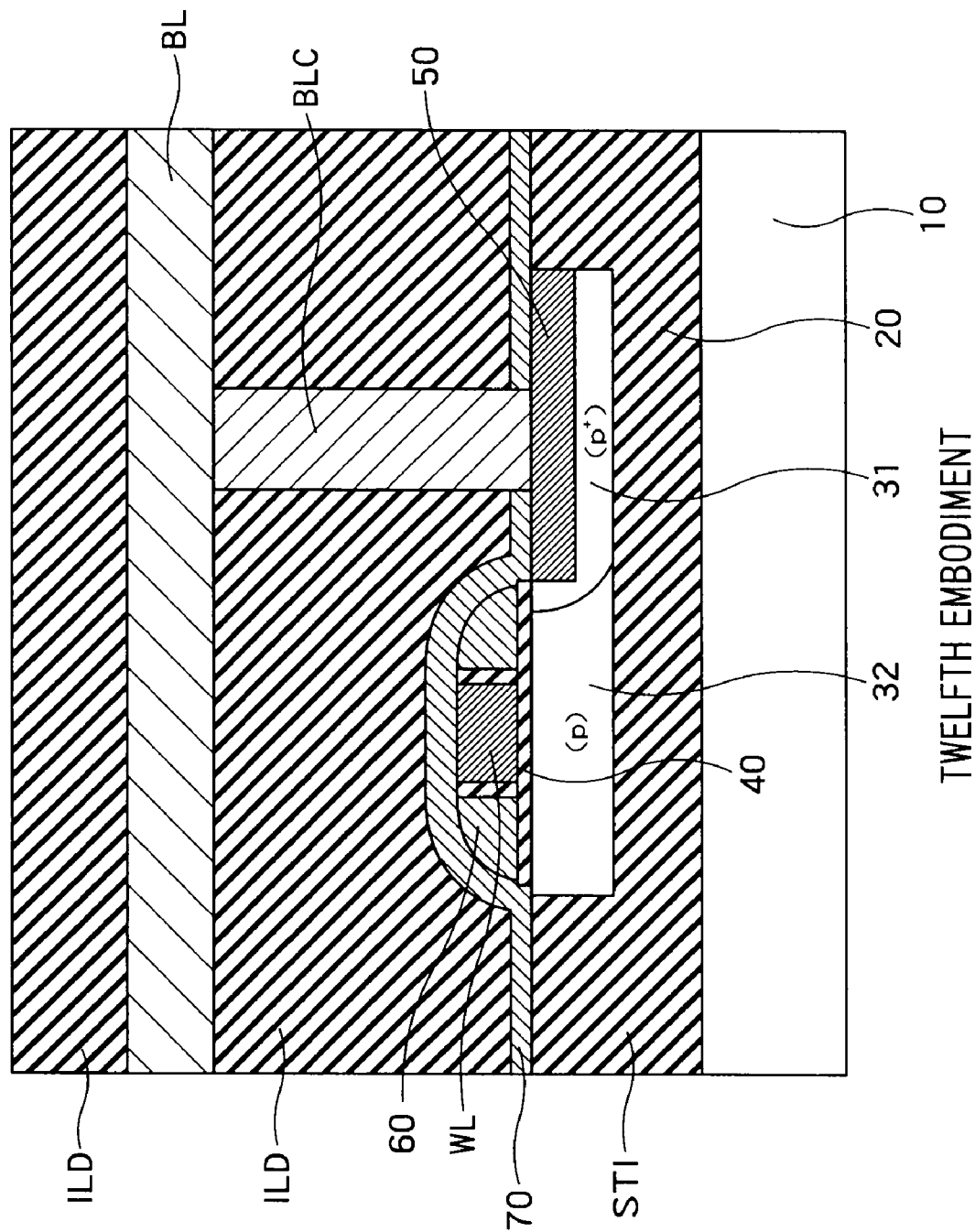
FIG. 27 is a cross-sectional view of an insulating-film breakdown ROM according to a twelfth embodiment of the present invention.

FIG. 27 is a cross-sectional view of an insulating-film breakdown ROM according to a twelfth embodiment of the present invention. The twelfth embodiment differs from the ninth embodiment in that the first semiconductor region 31 is a $p^+$-type semiconductor. Other parts of the configuration of the twelfth embodiment can be identical to the configuration of the ninth embodiment. That is, the twelfth embodiment is a combination of the fourth and ninth embodiments.

In the twelfth embodiment, similarly to the fourth embodiment, the pn junction is not formed between the first semiconductor region 31 and the second semiconductor region 32. Accordingly, a driving method of the twelfth embodiment is identical to that of the fourth embodiment. The twelfth embodiment achieves effects of both of the fourth and ninth embodiments.

Thirteenth Embodiment

Figure 28:
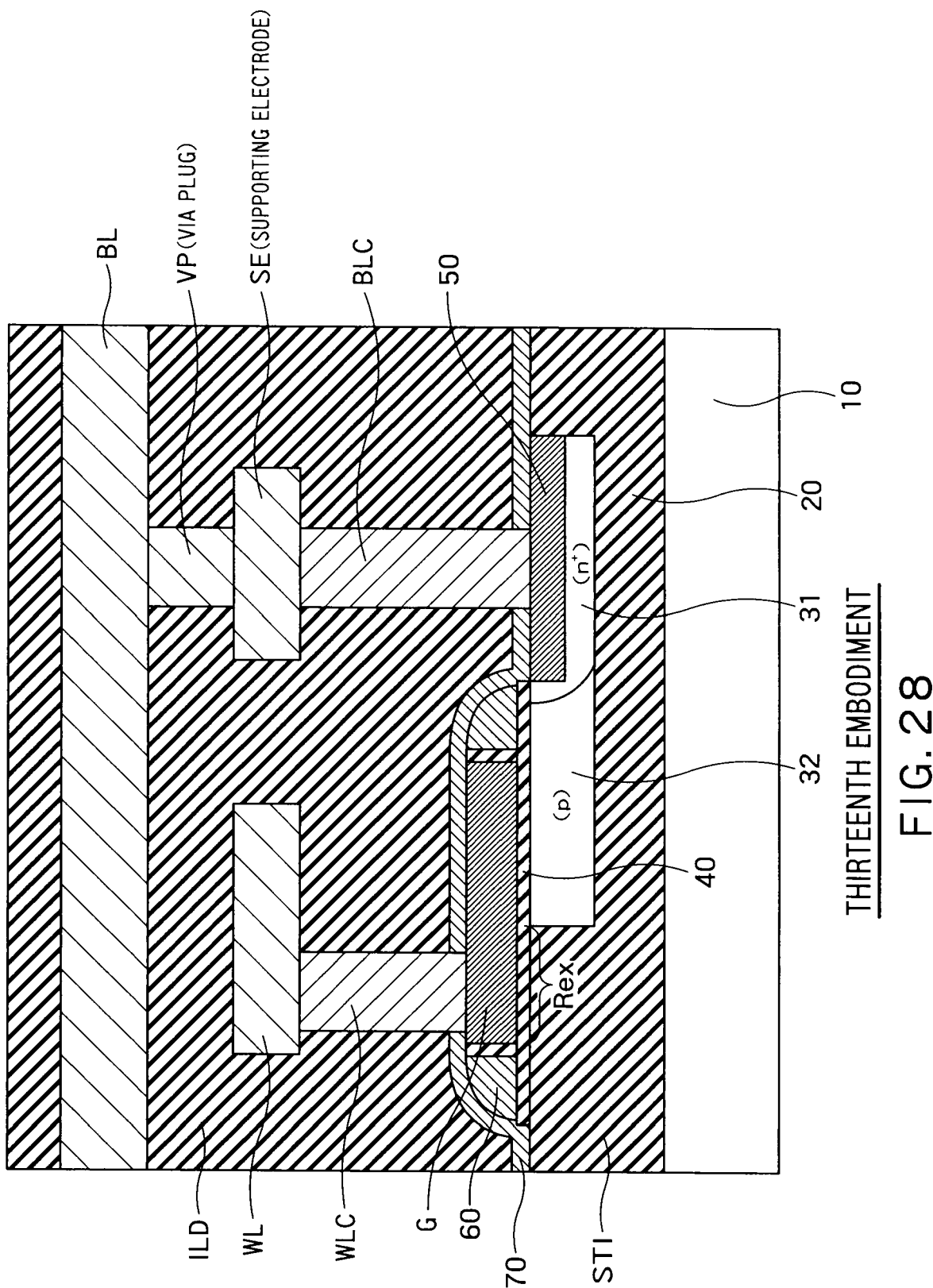
FIG. 28 is a cross-sectional view of an insulating-film breakdown ROM according to a thirteenth embodiment of the present invention.

FIG. 28 is a cross-sectional view of an insulating-film breakdown ROM according to a thirteenth embodiment of the present invention. In the thirteenth embodiment, similarly to the fifth embodiment, the word lines WL are arranged separately of gate electrodes G. The configurations of the word line WL, the word-line contact WLC, the bit line contact BLC, the supporting electrode SE, and the via plug VP can be identical to those of the fifth embodiment.

The gate electrode G is fully silicided similar to the word line WL of the ninth embodiment. The width in the column direction of the gate electrode G is formed to be wider than that of the word line WL of the ninth embodiment. The gate electrode G has an enlarged region Rex stuck out in the column direction from an edge on the second semiconductor region 32 side of the SOI layer 30. The word-line contact WLC is formed on the enlarged region Rex of the gate electrode G. Thereby, at the time of the formation of the word-line contact WLC, the gate dielectric film 41 is not adversely affected.

Thus, the thirteenth embodiment is a combination of the fifth and ninth embodiments. Accordingly, the thirteenth embodiment achieves effects of both of the fifth and ninth embodiments.

Fourteenth Embodiment

Figure 29:
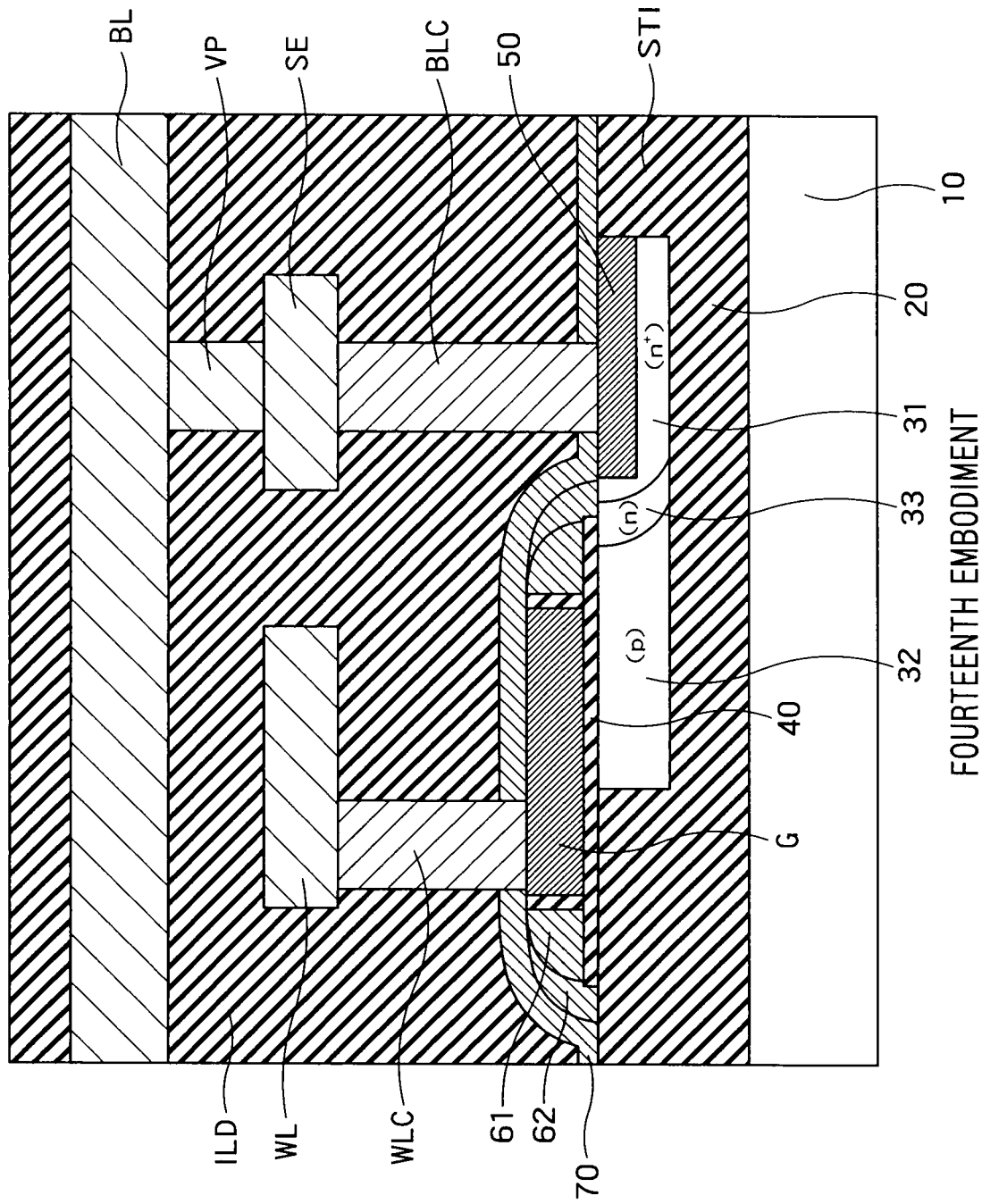
FIG. 29 is a cross-sectional view of an insulating-film breakdown ROM according to a fourteenth embodiment of the present invention.

FIG. 29 is a cross-sectional view of an insulating-film breakdown ROM according to a fourteenth embodiment of the present invention. The fourteenth embodiment differs from the thirteenth embodiment in that between the first semiconductor region 31 and the second semiconductor region 32, the n-type field relaxation layer 33 is further provided. The fourteenth embodiment is a combination of the second and thirteenth embodiments. Accordingly, the configurations of the first side-wall layer 61, the second side-wall layer 62, and the field relaxation layer 33, and the manufacturing method thereof can be identical to those of the second embodiment. The word line WL is fully silicided similarly to that in the thirteenth embodiment. The fourteenth embodiment achieves effects of both of the second and thirteenth embodiments.

Fifteenth Embodiment

Figure 30:
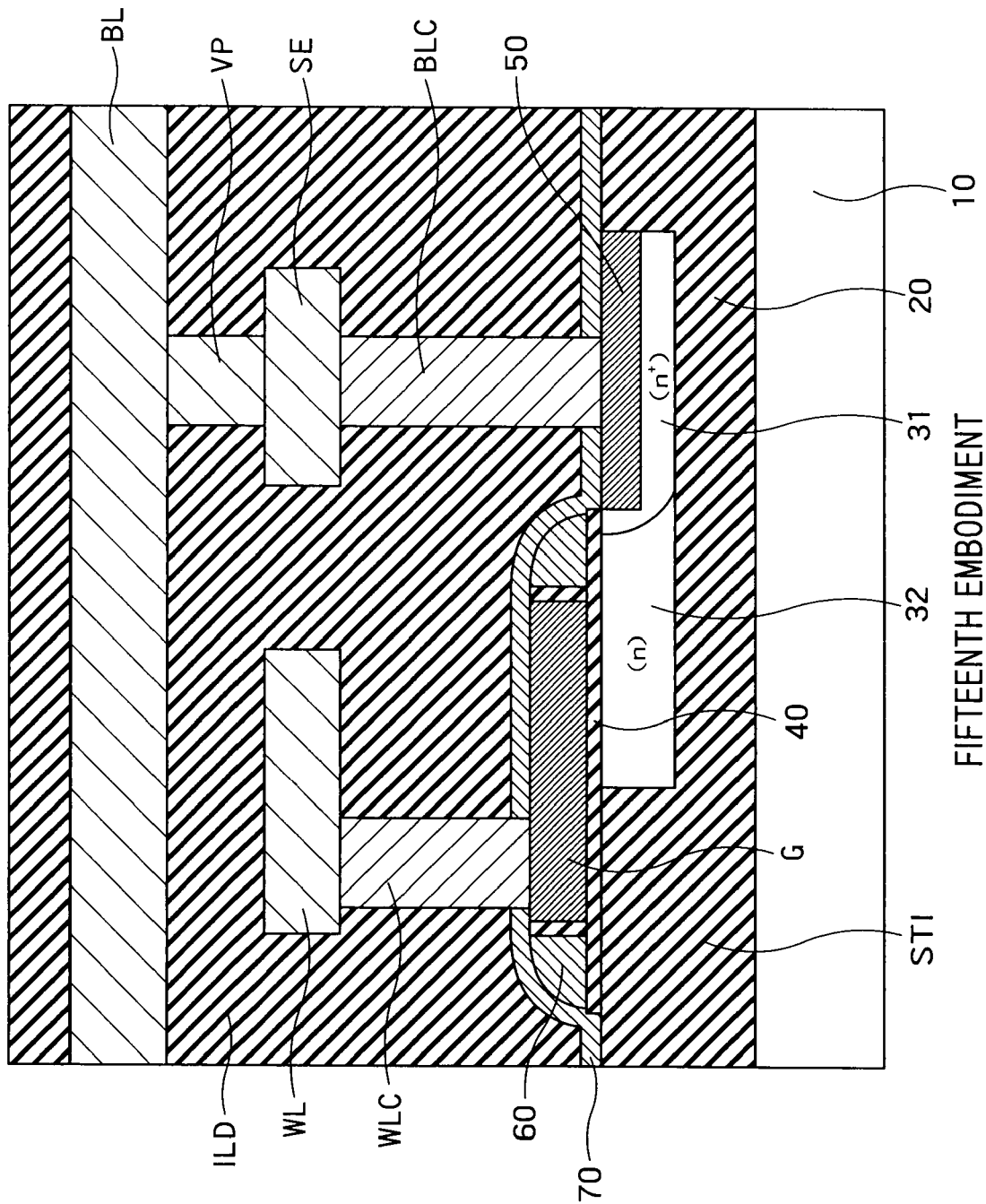
FIG. 30 is a cross-sectional view of an insulating-film breakdown ROM according to a fifteenth embodiment of the present invention.

FIG. 30 is a cross-sectional view of an insulating-film breakdown ROM according to a fifteenth embodiment of the present invention. The fifteenth embodiment differs from the thirteenth embodiment in that the second semiconductor region 32 is an n-type semiconductor. Other parts of the configuration of the fifteenth embodiment can be identical to the configuration of the thirteenth embodiment. That is, the fifteenth embodiment is a combination of the third and thirteenth embodiments.

In the fifteenth embodiment, similarly to the third embodiment, the pn junction is not formed between the first semiconductor region 31 and the second semiconductor region 32. Accordingly, a driving method of the fifteenth embodiment is identical to that of the third embodiment. The fifteenth embodiment achieves effects of both of the third and thirteenth embodiments.

Sixteenth Embodiment

Figure 31:
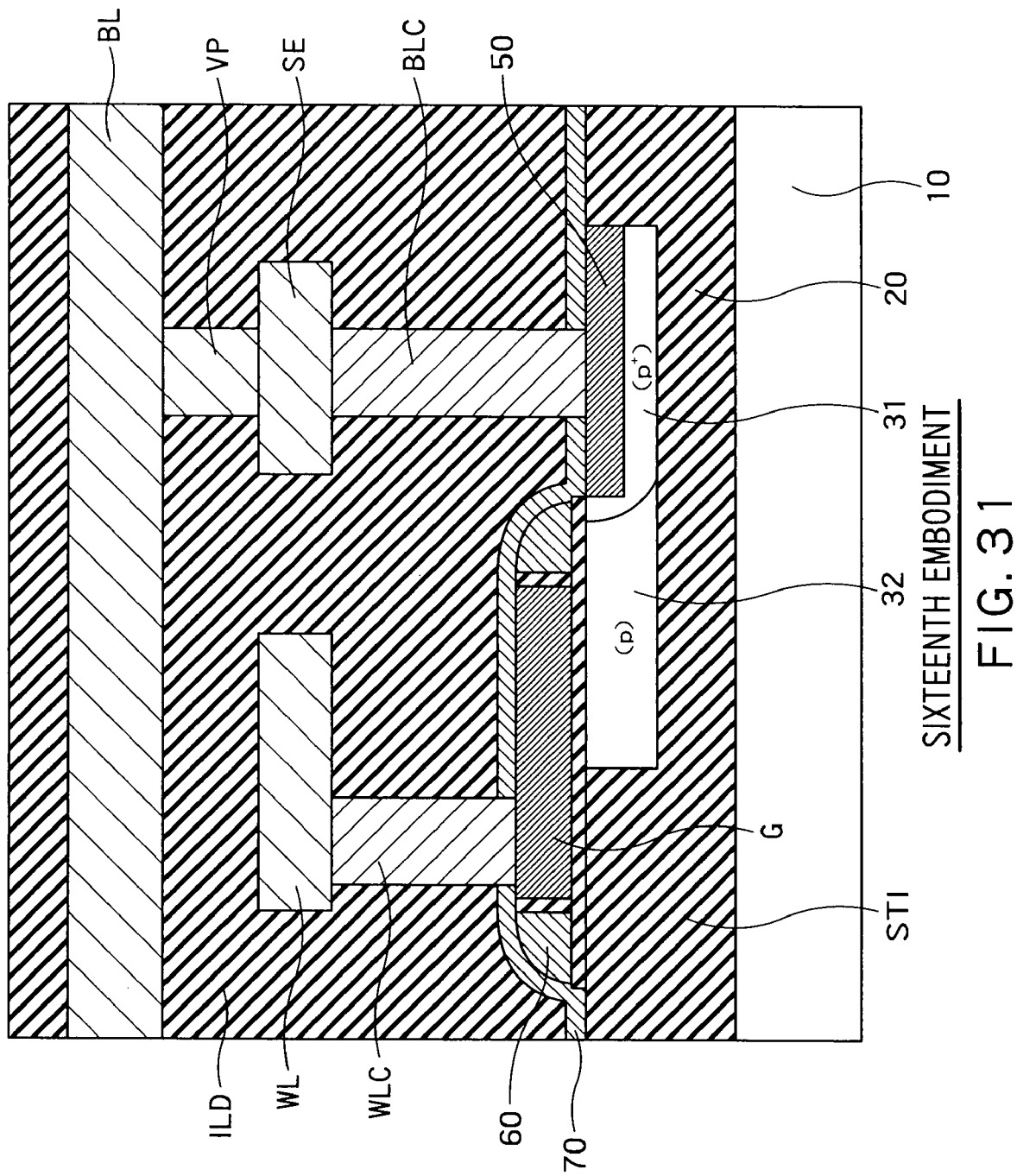
FIG. 31 is a cross-sectional view of an insulating-film breakdown ROM according to a sixteenth embodiment of the present invention.

FIG. 31 is a cross-sectional view of an insulating-film breakdown ROM according to a sixteenth embodiment of the present invention. The sixteenth embodiment differs from the thirteenth embodiment in that the first semiconductor region 31 is a $p^+$-type semiconductor. Other parts of the configuration of the sixteenth embodiment can be identical to the configuration of the thirteenth embodiment. That is, the sixteenth embodiment is a combination of the fourth and thirteenth embodiments.

In the sixteenth embodiment, similarly to the fourth embodiment, the pn junction is not formed between the first semiconductor region 31 and the second semiconductor region 32. Accordingly, a driving method of the sixteenth embodiment is identical to that of the fourth embodiment. The sixteenth embodiment achieves effects of both of the fourth and thirteenth embodiments.

In the above embodiments, the word-line insulating film 40 or the gate dielectric film 41 can be a material ($Ta_2O_5$, $BaTiO_3$, $BaZrO_3$, $ZrO_2$, $HfO_2$, and $Al_2O_3$) of which the dielectric constant is higher than those of a silicon oxide film, a silicon nitride film, or a silicon nitride film. Regarding the embodiments in which the word line WL or the gate electrode is the p-type semiconductor, an n-type semiconductor can be used instead of the p-type semiconductor for the word line WL or the gate electrode. In the above embodiments, the silicide is used for the gate electrode. However, a metal gate made of tungsten, and the like, can be used for the gate electrode. In this case, the metal gate electrode can further lower the wire resistance as compared to the silicide gate electrode.

The invention claimed is:

1. A semiconductor memory device comprising:
   bit lines extending in a first direction;
   word lines extending in a second direction crossing the first direction;
   semiconductor layers arranged to correspond to cross-points of the bit lines and the word lines;
   bit line contacts connecting between a first surface region and the bit lines, the first surface region being a part of a surface region of the semiconductor layers directed to the word lines and the bit lines; and
   a word-line insulating film formed on a second surface region adjacent to the first surface region, the second surface region being a part out of the surface region of the semiconductor layer, the word-line insulating film electrically insulating the semiconductor layer and the word line, wherein
   the semiconductor layer, the word line and the word-line insulating film form a capacitor, and
   when a potential difference is given between the word line and the bit line, the word-line insulating film is broken in order to store data, wherein
   the semiconductor layer includes a first semiconductor region of a first conductivity type beneath the first surface region and a second semiconductor region of a second conductivity type beneath the second surface region,
   the first semiconductor region and the second semiconductor region form therebetween a pn junction,
   one of the bit line contacts is connected to the first semiconductor region, and
   the word-line insulating film is formed on the second semiconductor region,
   the semiconductor memory device further comprises a field relaxation layer arranged in the semiconductor layer between the first semiconductor region and the second semiconductor region, an impurity concentration of the field relaxation layer being lower than that of the first semiconductor region.

2. The semiconductor memory device according to claim 1, wherein the second semiconductor region is arranged via the word-line insulating film immediately beneath one of the word lines, but the first semiconductor region is not arranged therebeneath.

3. The semiconductor memory device according to claim 1, wherein one of the word lines is formed by a semiconductor of a second conductivity type.

4. The semiconductor memory device according to claim 1, wherein one of the word lines is formed by a semiconductor of a first conductivity type.

5. The semiconductor memory device according to claim 1, wherein the word lines are fully silicided.

6. A semiconductor memory device comprising:
   bit lines extending in a first direction;
   word lines extending in a second direction crossing the first direction;
   semiconductor layers arranged to correspond to cross-points of the bit lines and the word lines;
   bit line contacts connecting between a first surface region and the bit lines, the first surface region being a part of a surface region of the semiconductor layers directed to the word lines and the bit lines; and
   a word-line insulating film formed on a second surface region adjacent to the first surface region, the second surface region being a part out of the surface region of the semiconductor layer, the word-line insulating film electrically insulating the semiconductor layer and the word line, wherein
   the semiconductor layer, the word line and the word-line insulating film form a capacitor, and
   when a potential difference is given between the word line and the bit line, the word-line insulating film is broken in order to store data, wherein
   the semiconductor layer includes a first semiconductor region of a first conductivity type beneath the first surface region and a second semiconductor region of a first conductivity type beneath the second surface region, wherein
   an impurity concentration of the first surface region is higher than an impurity concentration of the second surface region.

7. A semiconductor memory device comprising:
   bit lines extending in a first direction;
   word lines extending in a second direction crossing the first direction;
   semiconductor layers arranged to correspond to cross-points of the bit lines and the word lines;
   bit line contacts connecting between a first surface region and the bit lines, the first surface region being a part of a surface region of the semiconductor layers directed to the word lines and the bit lines; and
   a word-line insulating film formed on a second surface region adjacent to the first surface region, the second surface region being a part out of the surface region of the semiconductor layer, the word-line insulating film electrically insulating the semiconductor layer and the word line, wherein
   the semiconductor layer, the word line and the word-line insulating film form a capacitor, and
   when a potential difference is given between the word line and the bit line, the word-line insulating film is broken in order to store data, and further comprising:
   a metal wiring extending to the second direction on one of the word lines; and
   a metal plug connecting the metal wiring and the one of the word lines, wherein
   the one of word lines includes an enlarged region stuck out from one end of the word-line insulating film, and the metal plug contacts on the enlarged region out of one of the word lines.

8. The semiconductor memory device according to claim 7, wherein
   the semiconductor layer includes a first semiconductor region of a first conductivity type beneath the first surface region and a second semiconductor region of a second conductivity type beneath the second surface region, the first semiconductor region and the second semiconductor region form therebetween a pn junction, one of the bit line contacts is connected to the first semiconductor region, and the word-line insulating film is formed on the second semiconductor region.

9. The semiconductor memory device according to claim 8, wherein the second semiconductor region is arranged via the word-line insulating film immediately beneath one of the word lines, but the first semiconductor region is not arranged therebeneath.

10. The semiconductor memory device according to claim 8, further comprising a field relaxation layer arranged in the semiconductor layer between the first semiconductor region and the second semiconductor region, an impurity concentration of the field relaxation layer being lower than that of the first semiconductor region.

11. The semiconductor memory device according to claim 7, wherein the semiconductor layer includes a first semiconductor region of a first conductivity type beneath the first surface region and a second semiconductor region of a first conductivity type beneath the second surface region.

12. The semiconductor memory device according to claim 11, wherein an impurity concentration of the first surface region is higher than an impurity concentration of the second surface region.

13. The semiconductor memory device according to claim 11, wherein one of the word lines is formed by a semiconductor of a second conductivity type.

14. The semiconductor memory device according to claim 11, wherein one of the word lines is formed by a semiconductor of a first conductivity type.

15. The semiconductor memory device according to claim 7, wherein the word lines are fully silicided.

16. The semiconductor memory device according to claim 15, wherein the one of the word lines and the metal wiring respectively operate as a word line.

* * * * *